(12) United States Patent
Horikoshi

(10) Patent No.: US 8,896,039 B2
(45) Date of Patent: Nov. 25, 2014

(54) SOLID-STATE IMAGING DEVICE, METHOD FOR MANUFACTURING THE SAME, AND ELECTRONIC APPARATUS

(71) Applicant: Sony Corporation, Tokyo (JP)

(72) Inventor: Hiroshi Horikoshi, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/966,762

(22) Filed: Aug. 14, 2013

(65) Prior Publication Data

US 2013/0328152 A1    Dec. 12, 2013

Related U.S. Application Data

(62) Division of application No. 13/137,775, filed on Sep. 12, 2011, now Pat. No. 8,524,594.

(30) Foreign Application Priority Data

Oct. 4, 2010 (JP) .................... 2010-225090

(51) Int. Cl.
*H01L 31/062* (2012.01)
*H01L 31/113* (2006.01)
*H01L 27/146* (2006.01)

(52) U.S. Cl.
CPC ........ *H01L 27/146* (2013.01); *H01L 27/14683* (2013.01); *H01L 27/14636* (2013.01); *H01L 27/14621* (2013.01); *H01L 27/1462* (2013.01); *H01L 24/14627* (2013.01); *H01L 27/14685* (2013.01); *H01L 24/14625* (2013.01); *H01L 24/14629* (2013.01)

USPC ..... 257/292; 257/294; 257/691; 257/E27.131

(58) Field of Classification Search
CPC .............. H01L 27/307; H01L 27/1462; H01L 27/14636
USPC ........... 257/59, 291–294, 443–444, 448, 691, 257/700, E27.131
See application file for complete search history.

(56) References Cited

U.S. PATENT DOCUMENTS

| 5,438,222 A | 8/1995 | Yamazaki |
|---|---|---|
| 8,198,731 B2 | 6/2012 | Cichocki |
| 2006/0202615 A1* | 9/2006 | Murakami et al. ............ 313/506 |

FOREIGN PATENT DOCUMENTS

| JP | 62-012163 | 1/1987 |
|---|---|---|
| JP | 03-083365 | 4/1991 |
| JP | 3158466 | 2/2001 |
| JP | 3959710 | 5/2007 |

* cited by examiner

*Primary Examiner* — Thanhha Pham
(74) *Attorney, Agent, or Firm* — Rader, Fishman & Grauer PLLC

(57) ABSTRACT

A method for manufacturing a solid-state imaging device includes: forming pixels that receive incident light in a pixel array area of a substrate; forming pad electrodes in a peripheral area located around the pixel array area of the substrate; forming a carbon-based inorganic film on an upper surface of each of the pad electrodes including a connection surface electrically connected to an external component; forming a coated film that covers upper surfaces of the carbon-based inorganic films; and forming an opening above the connection surface of each of the pad electrodes to expose the connection surface.

20 Claims, 21 Drawing Sheets

FIG.3
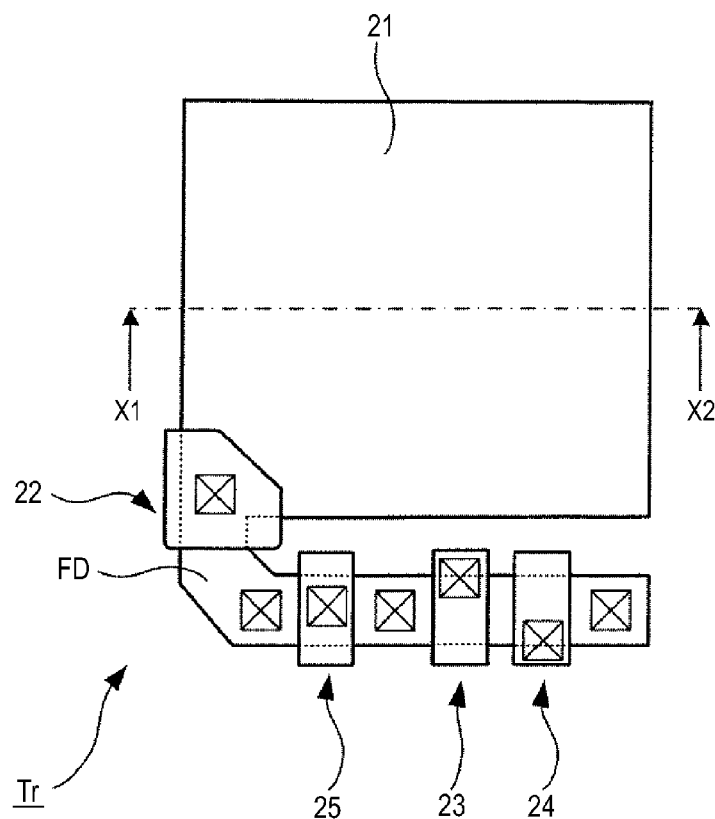
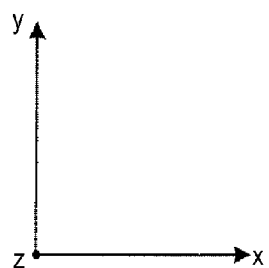

FIG.9
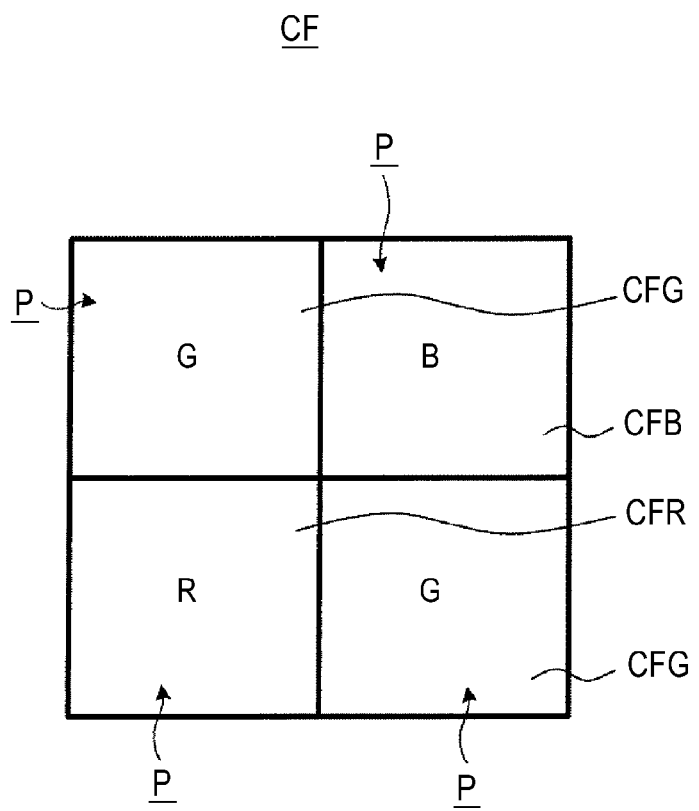
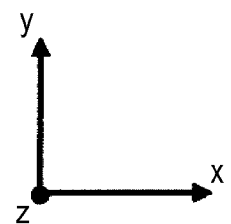

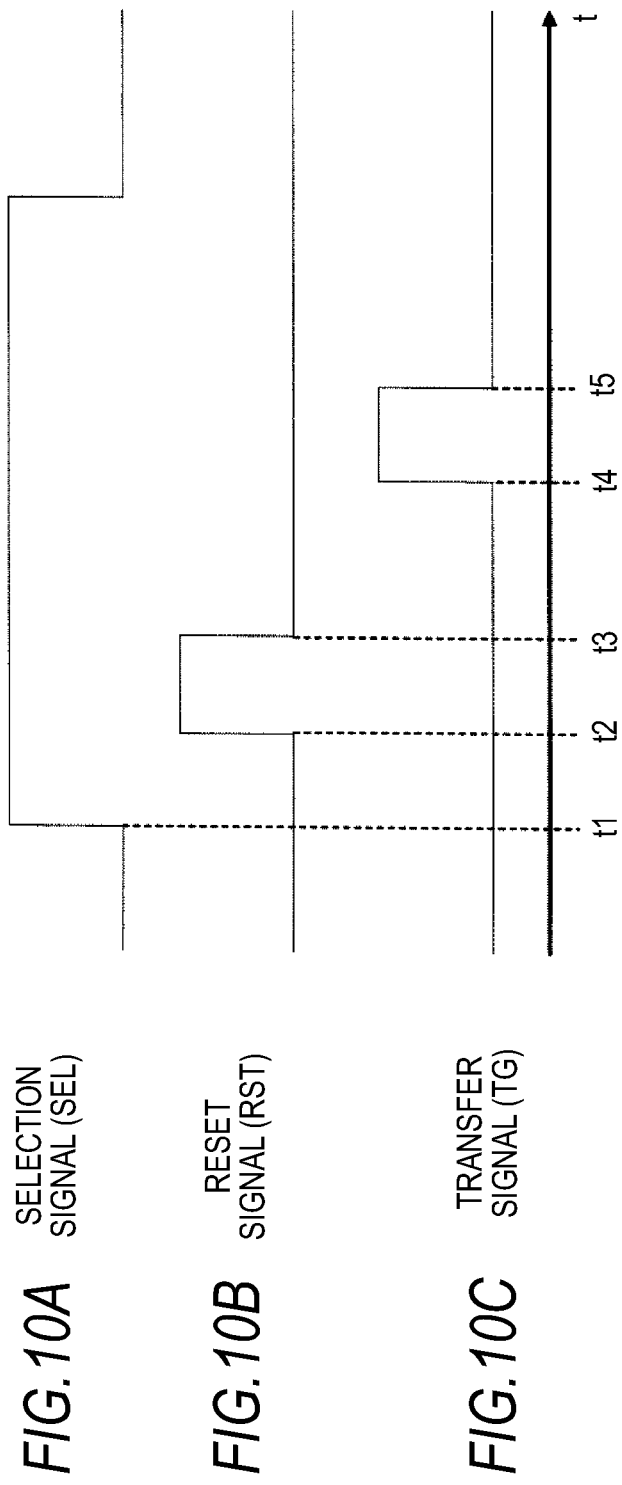

FIG.11A
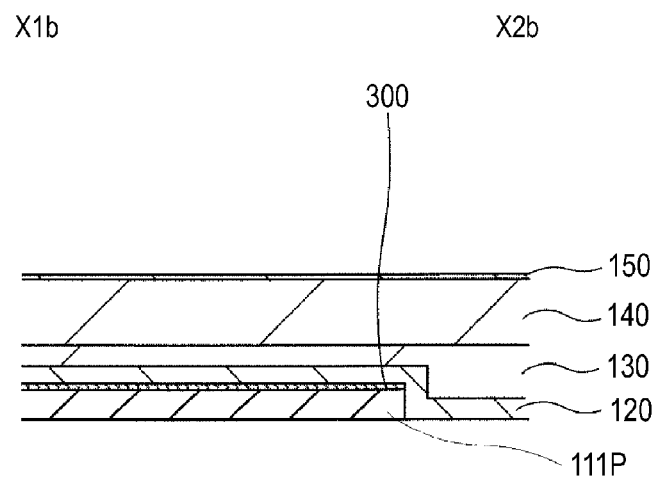
FIG.11B
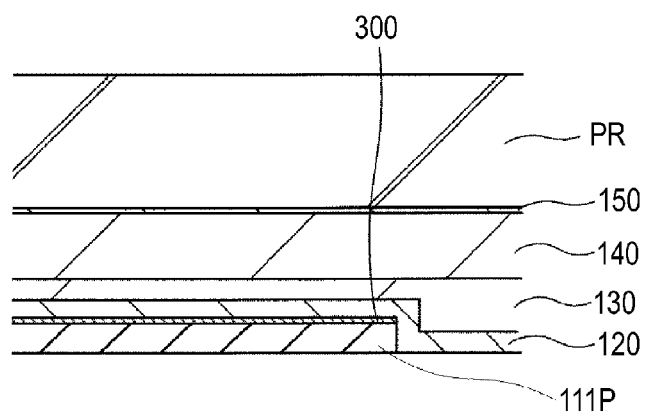
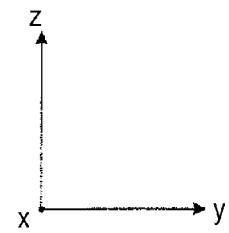

FIG.12C
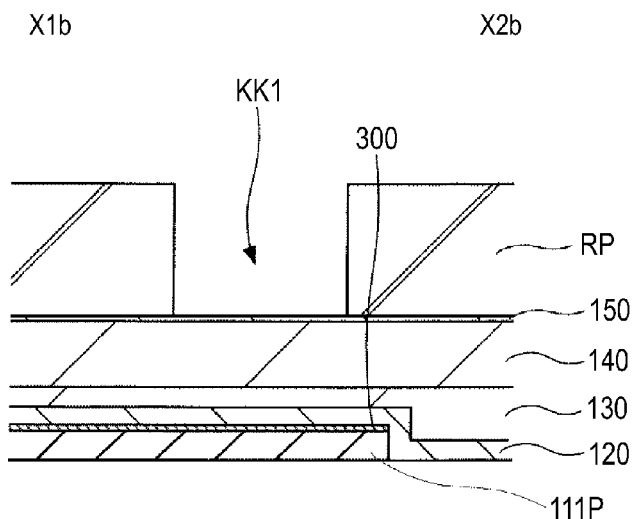
FIG.12D
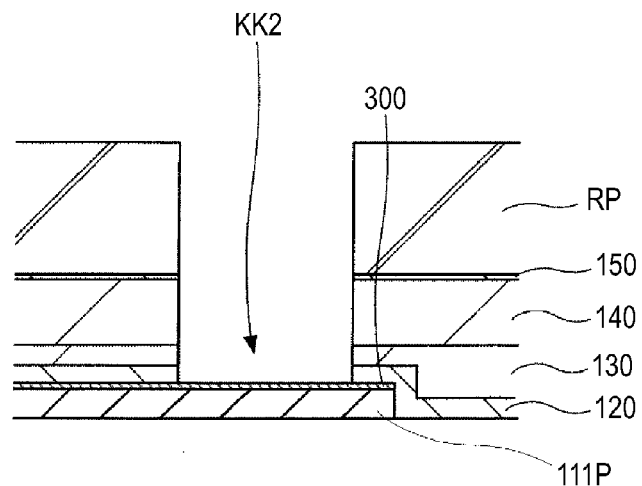
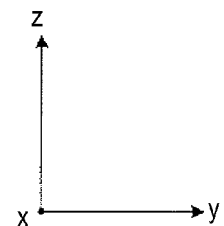

<COMPARATIVE EXAMPLE>

FIG.16
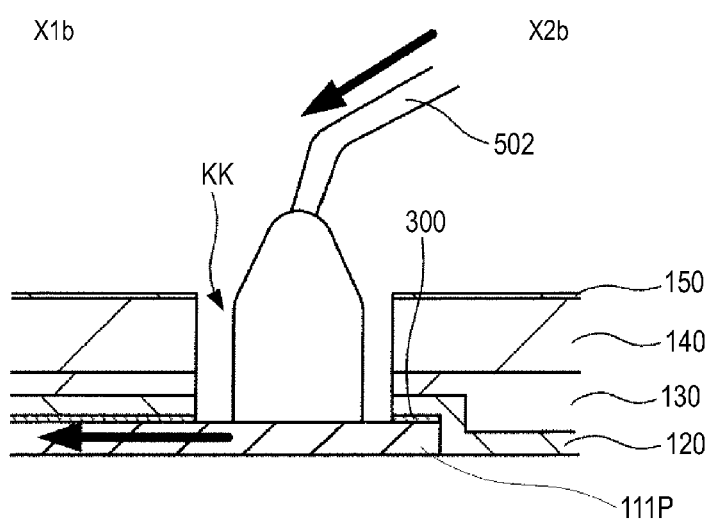
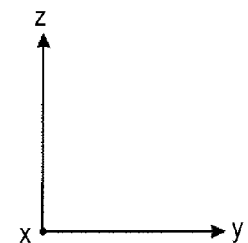

SOLID-STATE IMAGING DEVICE, METHOD FOR MANUFACTURING THE SAME, AND ELECTRONIC APPARATUS

CROSS REFERENCES TO RELATED APPLICATIONS

The present application is a divisional application of application Ser. No. 13/137,775 filed Sept. 12, 2011 which claims subject matter related to those disclosed in Japanese Priority Patent Applications JP2010-225090 filed in the Japan patent office on Oct. 4, 2010, the entire contents of which is hereby incorporated by reference.

FIELD

The present disclosure relates to a solid-state imaging device, a method for manufacturing the same, and an electronic apparatus.

BACKGROUND

An electronic apparatus, such as a digital camera, includes a solid-state imaging device. Examples of the solid-state imaging device include a CMOS (complementary metal oxide semiconductor) image sensor and a CCD (charge coupled device) image sensor.

In a solid-state imaging device, a pixel array area having a plurality of pixels arranged in a matrix is provided on a surface of a semiconductor substrate. Each of the plurality of pixels is provided with a photoelectric converter. The photoelectric converter is, for example, a photodiode. A light receiving surface of the photodiode receives light incident thereon via an optical system provided separately from the imaging device, and signal charge is produced in a photoelectric conversion process.

Among a variety of solid-state imaging devices, a CMOS image sensor is so configured that each pixel includes a plurality of transistors as well as the photoelectric converter. The plurality of transistors read the signal charge produced by the photoelectric converter and output the signal charge in the form of an electric signal to a signal line.

A semiconductor device, such as a solid-state imaging device, is provided with a pad electrode, which is provided to electrically connect the semiconductor device to an external component. For example, the semiconductor device is electrically connected to a board substrate, a semiconductor package, a semiconductor chip, or any other external component via the pad electrode.

The pad electrode is made, for example, of aluminum (Al). The pad electrode is alternatively made of an aluminum alloy containing silicon (Si), copper (Cu), and other elements.

For example, the semiconductor device, such as a solid-state imaging device, is electrically connected to an external device via the pad electrode by using a connection means, such as gold (Au)-based wire bonding and tin (Sn)-based solder reflow (see Japanese Patent Nos. 3,158,466 and 3,959,710, for example).

When a contaminant is present on the surface of the pad electrode, electrical connection failure between the semiconductor device and an external device may occur in some cases. The electrical connection failure may cause the solid-state imaging device not to operate normally, for example, to malfunction and eventually stop operating. To avoid such a situation, the surface of the pad electrode is so cleaned that any contaminant is removed.

For example, when layers provided on the pad electrode made of aluminum are dry etched by using a fluorine (F)-based etching gas, the fluorine (F) may become a contaminant on the pad electrode in some cases. To remove the fluorine (F) left on the pad electrode, it has been proposed to clean the surface of the pad electrode with an organic amine-based chemical solution (see "Investigation and Failure Analysis of "Flower-like" Defects on Microchip Aluminum Bondpads in Wafer Fabrication," ICSE2006 Proc. 2006, pp. 626-629, for example).

Further, the pad metal of the pad electrode may melt and corrode, resulting in malfunction of the device in some cases. To avoid such a situation, it has been proposed to electrically connect the semiconductor device to an external device via the pad electrode and then form a carbon film that covers the semiconductor device, the external device, and a wiring line that connects them to each other (see JP-A-3-83365 and JP-A-62-12163, for example).

SUMMARY

FIGS. 17A, 17B, 18C, and 18D show key steps of manufacturing a solid-state imaging device. FIGS. 17A, 17B, 18C, and 18D sequentially show steps (a), (b), (c), and (d) of exposing the surface of a pad electrode 111P in the solid-state imaging device. FIGS. 17A, 17B, 18C, and 18D are cross-sectional views showing a portion of the solid-state imaging device where the pad electrode 111P is formed.

A resist pattern RP is first formed, as shown in FIG. 17A.

Before forming the resist pattern RP, the pad electrode 111P is formed, for example, with aluminum, as shown in FIG. 17A. Components are then provided to cover the pad electrode 111P. Specifically, a passivation film 120, a planarization film 130, a lens material film 140, and an antireflection film 150 are sequentially provided on the upper surface of the pad electrode 111P. Although not shown, an on-chip lens is formed by using the lens material film 140 for each effective pixel in the pixel array area, where effective pixels are arranged, in the solid-state imaging device. The on-chip lenses (not shown) are formed by using the lens material film 140 made, for example, of a resin or any other suitable organic material. In addition to the on-chip lenses, a color filter (not shown) is formed for each effective pixel in the pixel array area (see FIG. 9, which will be described later).

After the components are formed to cover the pad electrode 111P as described above, the resist pattern RP is formed on the upper surface of the antireflection film 150.

In this example, after a photoresist film (not shown) is formed to cover the upper surface of the antireflection film 150, the photoresist film (not shown) is patterned to form the resist pattern RP. Specifically, the resist pattern RP is formed by providing an opening KK1 through the photoresist film in such a way that the opening KK1 exposes a portion of the upper surface of the pad electrode 111P.

The components provided on the upper surface of the pad electrode 111P are then removed until the portion of the surface of the pad electrode 111P is exposed, as shown in FIG. 17B.

In this step, the resist pattern RP is used as a mask, and the antireflection film 150, the lens material film 140, the planarization film 130, and the passivation film 120 are sequentially dry etched. An opening KK2 is thus provided, and the portion of the surface of the pad electrode 111P is exposed.

The components are dry etched, for example, by using a fluorine (F)-based etching gas, such as $CF_4$, $C_2F_6$, $C_3F_8$, $CHF_3$, and $SF_6$.

At this point, the exposed surface of the pad electrode 111P is damaged by the dry etching, and an etching damage portion DM is formed.

The resist pattern RP is then removed, as shown in FIG. 18C.

In this example, the resist pattern RP is removed from the upper surface of the antireflection film 150 by performing ashing.

The etching damage portion DM is then removed, as shown in FIG. 18D.

In this example, the etching damage portion DM is removed by performing a post-treatment of cleaning the surface of the pad electrode 111P. The surface of the pad electrode 111P is cleaned, for example, by using an organic amine-based chemical solution.

In the solid-state imaging device, however, the cleaning described above erodes the on-chip lens (not shown) made of a resin and degrades the lens performance in some cases. For example, the height of the lens may be reduced and the focal point is therefore shifted, or the surface of the lens may be changed and the amount of incident light is therefore reduced.

As a result, in the solid-state imaging device, the quality of captured images may be degraded in some cases.

Further, a contaminant may be left on the etching damage portion DM when the cleaning described above is performed improperly.

FIGS. 19A to 19C show the surface of the pad electrode resulting from improper cleaning. FIG. 19A is a photograph obtained by capturing an image of the upper surface of the pad electrode 111P, and FIGS. 19B and 19C are enlarged SEM microphotographs obtained by capturing images of contaminants formed on the pad electrode 111P.

Circular contaminants are observed on the upper surface of the pad electrode 111P when it is left in the atmosphere, as shown in FIGS. 19A to 19C.

When dry etching is performed (see FIG. 17B), the fluorine (F)-based etching gas is converted into plasma and forms ions or radicals. The resultant active fluorine (F) reacts with the aluminum that forms the pad electrode 111P to produce a compound of aluminum and fluorine ($AlF_x$). It is believed that the dry etching thus leaves active fluorine (F) on the pad electrode 111P and $AlF_x$ is produced as a contaminant.

In particular, when the layers on the pad electrode 111P made of pure Al or an AlCu alloy are dry etched by using $SF_6$ or $CHF_3$ as an etching gas, a large number of contaminants may be produced in some cases.

FIGS. 20A to 20C show temporal change in the surface of the pad electrode. FIGS. 20A to 20C are photographs obtained by capturing images of the upper surface of the pad electrode 111P under an optical microscope. FIG. 20A shows the upper surface immediately after the pad electrode is formed. FIG. 20B shows the upper surface left in the atmosphere for three days. FIG. 20C shows the upper surface left in the atmosphere for six days.

The contaminants grow to larger sizes with time, as shown in FIGS. 20A to 20C.

FIGS. 21A to 21C show results of component analysis made on a contaminant. FIG. 21A is a SEM microphotograph showing a cross section of a contaminant, and FIGS. 21B and 21C show results of component analysis made on the contaminant. FIG. 21B shows a result of the component analysis made at a point A, which is the center of the contaminant, as shown in FIG. 21A. FIG. 21C shows a result of the component analysis made at a point B, which is located in a lower portion of the contaminant, as shown in FIG. 21A.

The contaminant contains not only aluminum (Al) but also fluorine (F), oxygen (O), and carbon (C), as shown in FIGS. 21B and 21C. From the results described above, the mechanism according to which the contaminant grows is speculated as follows.

The $AlF_x$ produced as a contaminant on the pad electrode 111P made of aluminum (Al) reacts with moisture in the atmosphere, and hydrogen fluoride (HF) is produced. Melted aluminum then reacts with the hydrogen fluoride (HF), and $AlF_x$ is newly produced. The cycle is repeated and the contaminant grows to a larger size.

That is, it is speculated that the contaminant grows when the reactions expressed by the following chemical formulae (1) and (2) (when x=3) are repeated.

$$AlF_3 + 3H_2O \rightarrow Al(OH)_3 + 3HF \tag{1}$$

$$Al + 3F^- \xrightarrow{AlF_3} + 3e^- \tag{2}$$

When $AlF_x$ is present as a contaminant on the upper surface of the pad electrode 111P, the bond between the pad electrode 111P and an electricity supplying metal configured as a connection means, such as wire bonding, is significantly degraded, sometimes resulting in non-ohmic connection or open connection.

As a result, the contaminant present on the surface of the pad electrode 111P may cause the solid-state imaging device not to operate normally in some cases unless the cleaning has been performed properly.

Since the cleaning is, however, necessary in the manufacturing process, it is sometimes difficult to manufacture the device efficiently.

In addition to the above problem, in the solid-state imaging device, incident light may be reflected off the pad electrode 111P, and what is called a ghost phenomenon may occur, sometimes resulting in degradation in quality of captured images. Further, electro-migration and stress-migration phenomena may occur at the pad electrode, sometimes resulting in decrease in wiring reliability. Moreover, heat generation may degrade reliability of the device in some cases.

As described above, it is sometimes difficult to improve the reliability and manufacturing efficiency of the solid-state imaging device.

It is therefore desirable to provide a solid-state imaging device, a method for manufacturing the same, and an electronic apparatus that allow improvement in reliability and manufacturing efficiency of the device.

A method for manufacturing a solid-state imaging device according to an embodiment of the present disclosure includes: forming pixels that receive incident light in a pixel array area of a substrate, forming pad electrodes in a peripheral area located around the pixel array area of the substrate, forming a carbon-based inorganic film on an upper surface of each of the pad electrodes including a connection surface electrically connected to an external component, forming a coated film that covers upper surfaces of the carbon-based inorganic films, and forming an opening above the connection surface of each of the pad electrodes to expose the connection surface. The opening formation step includes forming a resist pattern on an upper surface of the coated film, the resist pattern having openings corresponding to the connection surfaces and covering portions other than the connection surfaces, etching the coated film by using the resist pattern as a mask and the carbon-based inorganic films as etching stopper films to expose portions of the upper surfaces of the carbon-based inorganic films that correspond to the connection surfaces, and performing ashing on the resist pattern and portions of the carbon-based inorganic films that correspond to the connection surfaces to simultaneously remove the resist pattern and the portions.

A solid-state imaging device according to another embodiment of the present disclosure includes: a substrate having pixels that receive incident light provided in a pixel array area, pad electrodes formed in a peripheral area located around the pixel array area of the substrate, a carbon-based inorganic film formed on an upper surface of each of the pad electrodes but other than a connection surface electrically connected to an external component, and a coated film that covers upper surfaces of the carbon-based inorganic films and has openings formed above the connection surfaces of the pad electrodes.

An electronic apparatus according to still another embodiment of the present disclosure includes: a substrate having pixels that receive incident light provided in a pixel array area, pad electrodes formed in a peripheral area located around the pixel array area of the substrate, a carbon-based inorganic film formed on an upper surface of each of the pad electrodes but other than a connection surface electrically connected to an external component, and a coated film that covers upper surfaces of the carbon-based inorganic films and has openings formed above the connection surfaces of the pad electrodes.

In the embodiments of the present disclosure, a resist pattern is so formed on the upper surface of a coated film that the resist pattern has openings corresponding to the connection surfaces of the pad electrodes and covers portions other than the connection surfaces. The resist pattern is used as a mask and the carbon-based inorganic films are used as etching stopper films to etch the coated film so that the portions of the upper surfaces of the carbon-based inorganic films that correspond to the connection surfaces are exposed. Ashing is then performed on the resist pattern and the portions of the carbon-based inorganic films that correspond to the connection surfaces to remove the resist pattern and the portions. As described above, the connection surfaces, which will be exposed, of the pad electrodes are covered with the carbon-based inorganic films in the etching process. The connection surfaces of the pad electrodes are therefore not damaged in the etching process.

The embodiments of the present disclosure can provide a solid-state imaging device, a method for manufacturing the same, and an electronic apparatus that allow improvement in reliability and manufacturing efficiency of the device.

BRIEF DESCRIPTION OF THE DRAWINGS

FIG. 3 shows a key portion of the solid-state imaging device according to the embodiment of the present disclosure;

FIG. 9 shows a color filter CF according to the embodiment of the present disclosure;

FIGS. 10A to 10C are timing charts illustrating pulse signals supplied to relevant components when a signal is read from a pixel P in the embodiment according to the present disclosure;

FIGS. 11A and 11B show a key portion formed in steps in a method for manufacturing the solid-state imaging device in the embodiment of the present disclosure;

FIGS. 12C and 12D show the key portion formed in steps in the method for manufacturing the solid-state imaging device in the embodiment of the present disclosure;

FIG. 16 diagrammatically shows a state in which current flows through a pad electrode in the embodiment according to the present disclosure;

DETAILED DESCRIPTION

Figure 1:
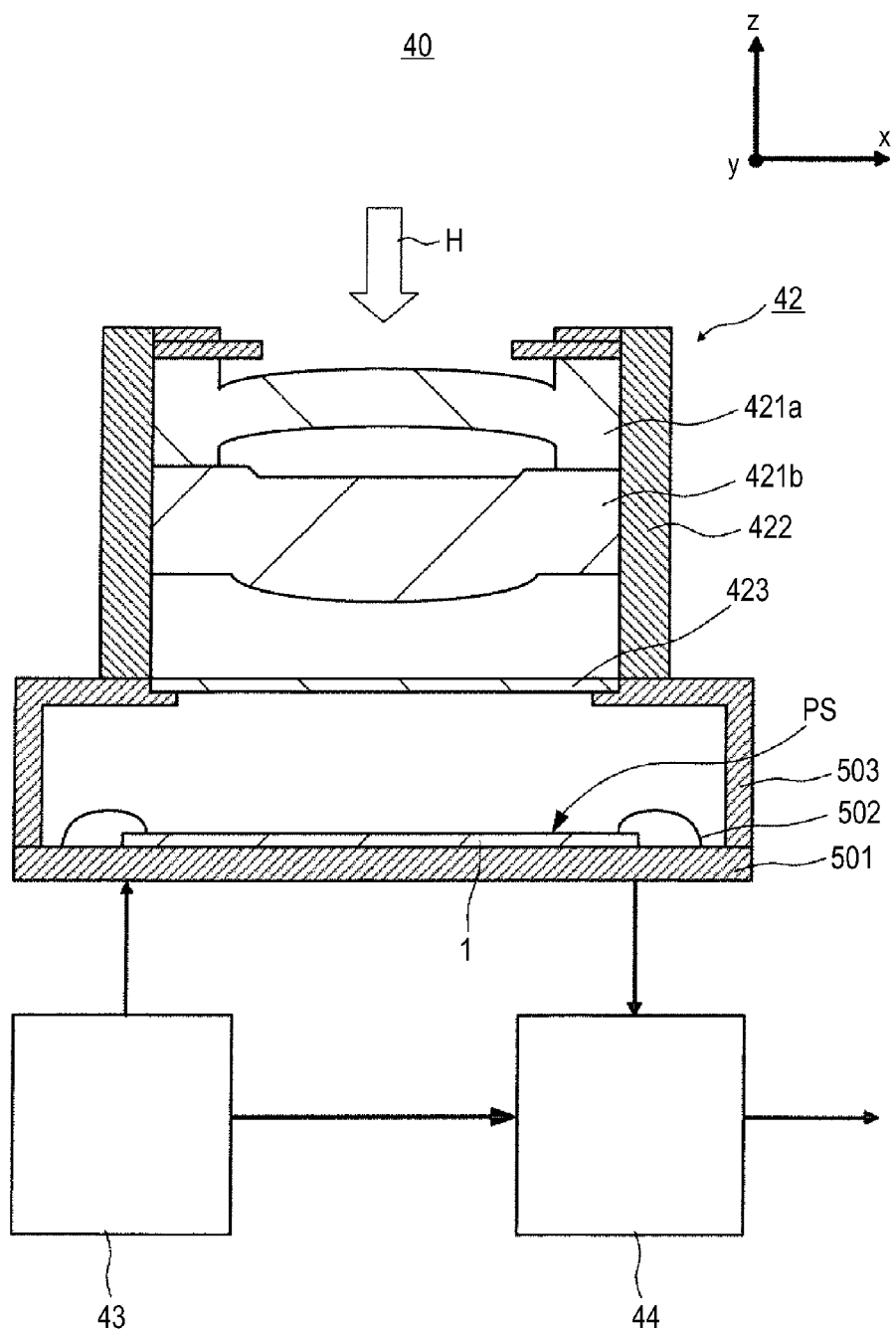
FIG. 1 is a diagram showing the configuration of a camera according to an embodiment of the present disclosure.

An embodiment of the present disclosure will be described below with reference to the drawings.
(A) Configuration of Apparatus
(A-1) Configuration of Key Portion of Camera FIG. 1 is a diagram showing the configuration of a camera 40 according to an embodiment of the present disclosure. FIG. 1 diagrammatically shows the overall configuration of the camera 40.

The camera 40 is an electronic apparatus and includes a solid-state imaging device 1, an optical system 42, a control circuit unit 43, and a signal processing circuit unit 44, as shown in FIG. 1.

The solid-state imaging device 1 is disposed on the upper surface of a substrate 501, as shown in FIG. 1. The solid-state imaging device 1 is electrically connected to the substrate 501 with wires 502. The solid-state imaging device 1, which will be described later in detail, is provided with pad electrodes (not shown), which are electrically connected via the wires 502 to wiring lines (not shown) provided in the substrate 501.

A lid 503 is disposed above the solid-state imaging device 1. The upper surface of the lid 503 has an opening, and the solid-state imaging device 1 receives incident light H incident as a subject image through the opening. The optical system 42 is disposed above the solid-state imaging device 1. The incident light H incident through the optical system 42 is received by an imaging surface PS and undergoes photoelectric conversion. Signal charge is thus produced in the photoelectric conversion. The solid-state imaging device 1, which is driven based on a control signal outputted from the control circuit unit 43, reads the signal charge and outputs it as raw data.

The optical system 42 includes lenses 421a and 421b and an IR cutoff filter 423, as shown in FIG. 1. In the optical system 42, the lenses 421a and 421b are disposed in a lens holder 422. The IR cutoff filter 423 is disposed on a lower surface of the lens holder 422. In the optical system 42, the incident light H sequentially passes through the lenses 421a and 421b and the IR cutoff filter 423 and reaches the imaging surface PS of the solid-state imaging device 1.

The control circuit unit 43 outputs a variety of control signals to the solid-state imaging device 1 and the signal processing circuit unit 44 to control the operation thereof.

The signal processing circuit unit 44 performs signal processing on the raw data outputted from the solid-state imaging device 1 to produce a digital image of the subject image.

(A-2) Configuration of Key Portion of Solid-State Imaging Device

An overall configuration of the solid-state imaging device 1 will be described.

Figure 2:
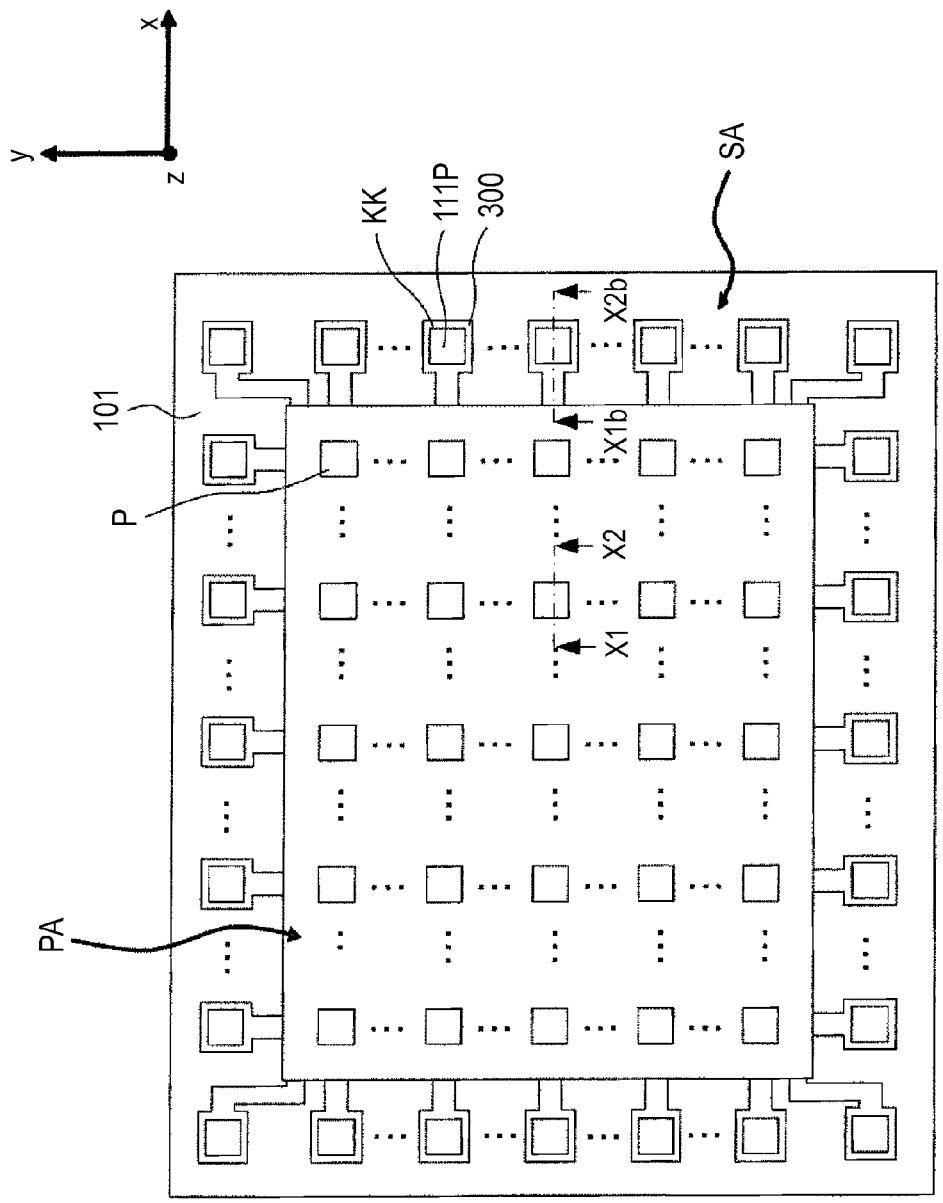
FIG. 2 shows an overall configuration of a solid-state imaging device according to the embodiment of the present disclosure.

FIG. 2 shows an overall configuration of the solid-state imaging device 1 according to the embodiment of the present disclosure. FIG. 2 is a top view of the solid-state imaging device 1.

The solid-state imaging device 1 includes a substrate 101, as shown in FIG. 2. The substrate 101 is, for example, a semiconductor substrate made of silicon, and a pixel array area PA and a peripheral area SA are provided on a surface of the substrate 101, as shown in FIG. 2.

The pixel array area PA has a rectangular shape and has a plurality of pixels P arranged in the horizontal direction x and the vertical direction y, as shown in FIG. 2. That is, the pixels P are arranged in a matrix. The pixels P will be described later in detail. The pixel array area PA corresponds to the imaging surface PS shown in FIG. 1.

The peripheral area SA is located around the pixel array area PA, as shown in FIG. 2. In the peripheral area SA, a plurality of pad electrodes 111P are so provided that they surround the pixel array area PA. Each of the pad electrodes 111P is provided with a carbon-based inorganic film 300 in a portion other than a surface (square portion in FIG. 2) electrically connected to an external component.

Although not shown, the peripheral area SA is provided with peripheral circuits.

For example, a vertical drive circuit, a column circuit, a horizontal drive circuit, an external output circuit, and a timing generator are provided as the peripheral circuits.

Specifically, the vertical drive circuit selects pixels P in the pixel array area PA on a row basis and drives the selected pixels P. The column circuit performs signal processing on signals outputted from pixels P on a column basis. The column circuit includes a CDS (correlated double sampling) circuit (not shown) and performs signal processing for removing fixed pattern noise. The horizontal drive circuit includes, for example, a shift register and sequentially outputs signals held in the column circuit for each column of pixels P to the external output circuit. The external output circuit performs signal processing on the signals outputted from the column circuit and outputs the processed signals to an external component. The external output circuit includes, for example, an AGC (automatic gain control) circuit and an ADC circuit. The AGC circuit amplifies each of the signals, and then the ADC circuit converts the analog signal into a digital signal and outputs the digital signal to an external component. The timing generator outputs a variety of timing signals to the components described above, which are driven and controlled according to the control signals.

In the present embodiment, the peripheral circuits are integrated with the solid-state imaging device 1 but may alternatively be formed in other external devices.

(A-3) Detailed Configuration of Solid-State Imaging Device

The solid-state imaging device 1 according to the present embodiment will be described in detail.

FIGS. 3 to 6 show key portions of the solid-state imaging device 1 according to the embodiment of the present disclosure.

Figure 4:
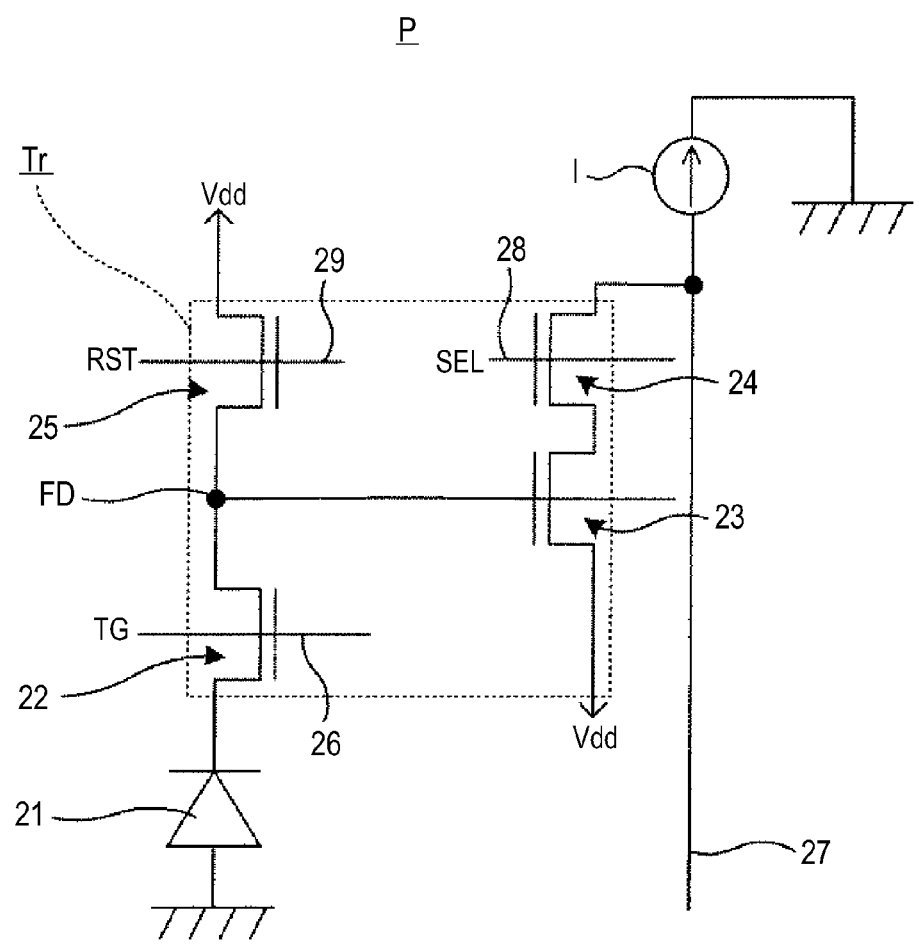
FIG. 4 shows a key portion of the solid-state imaging device according to the embodiment of the present disclosure.
Figure 5:
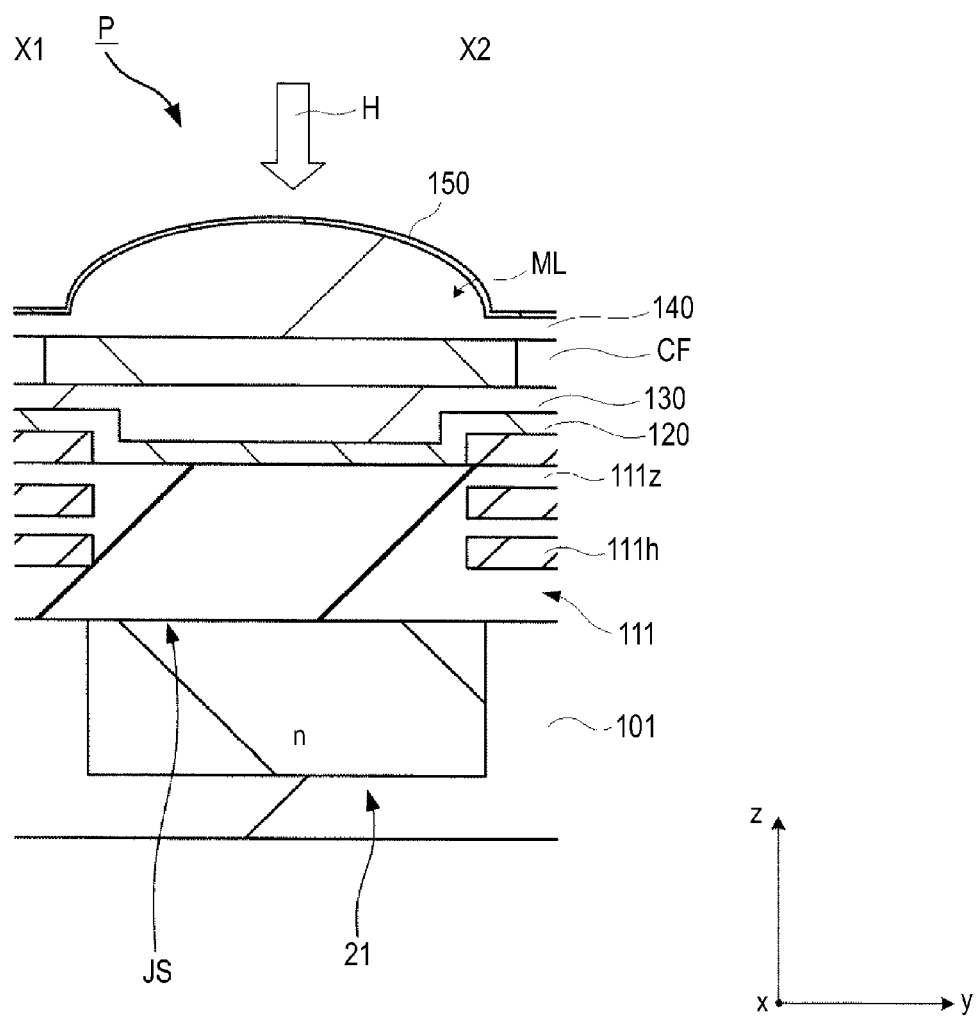
FIG. 5 shows a key portion of the solid-state imaging device according to the embodiment of the present disclosure.
Figure 6:
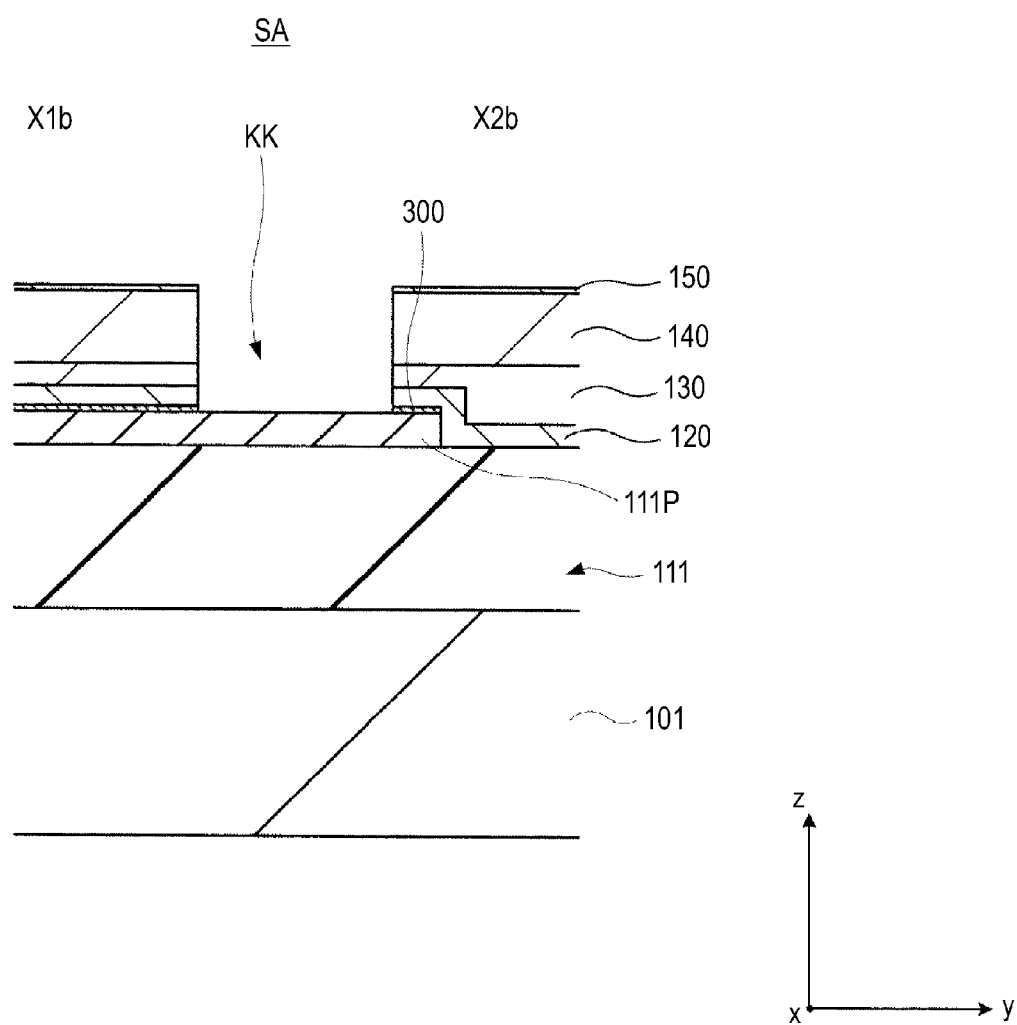
FIG. 6 shows a key portion of the solid-state imaging device according to the embodiment of the present disclosure.

FIG. 3 diagrammatically shows the upper surface of the portion of the pixel array area PA where a pixel P is provided. FIG. 4 shows a circuit configuration of the pixel P. FIG. 5 is a cross-sectional view diagrammatically showing the portion described above. Specifically, FIG. 5 is a cross-sectional view taken along the line X1-X2 shown in FIGS. 2 and 3. FIG. 6 is a cross-sectional view of the portion of the peripheral area SA where a pad electrode 111P is provided. Specifically, FIG. 6 is a cross-sectional view taken along the line X1$b$-X2$b$ shown in FIG. 2.

In the pixel array area PA, each of the pixels P includes a photodiode 21 and a pixel transistor Tr, as shown in FIGS. 3 and 4. The pixel transistor Tr includes a transfer transistor 22, an amplifier transistor 23, a selector transistor 24, and a reset transistor 25, reads signal charge from the photodiode 21, and outputs the signal charge in the form of an electric signal.

In each of the pixels P, the photodiode 21 is provided in the substrate 101, as shown in FIG. 5. Although not shown in FIG. 5, the pixel transistor Tr shown in FIGS. 3 and 4 is provided in the front surface (upper surface in FIG. 5) of the substrate 101. A multilayer wiring layer 111 is provided to cover the pixel transistor Tr, as shown in FIG. 5. Further, above the multilayer wiring layer 111 are provided a passivation film 120, a planarization film 130, a color filter CF, an on-chip lens ML, and an antireflection film 150.

In each of the pixels P, the incident light H is incident downward, passes through the components described above, and received by a light receiving surface JS of the photodiode 21.

That is, the solid-state imaging device 1 of the present embodiment is a "front surface illumination" CMOS image sensor and receives the incident light H incident as a subject image through the front surface of the substrate 101 to capture a color image.

In the peripheral area SA, a wiring line in the uppermost layer that forms part of the multilayer wiring layer 111 is provided as the pad electrode 111P, as shown in FIG. 6. Carbon-based inorganic films 300 are further provided in the peripheral area SA. The passivation film 120 and the planarization film 130 are so provided that they cover the multilayer wiring layer 111 via the carbon-based inorganic films 300, as in the case of the pixel array area PA. No color filter CF or on-chip lens ML (see FIG. 5) is provided in the peripheral area SA. The lens material film 140, which forms the on-chip lenses ML (see FIG. 5) in the pixel array area, is provided on the upper surface of the planarization film 130 in the peripheral area SA. The antireflection film 150 is then so provided that it covers the upper surface of the lens material film 140.

The components that form the solid-state imaging device 1 will now be described in detail.

(a) Photodiode 21

The photodiode 21 is disposed at a plurality of locations corresponding to the plurality of pixels P shown in FIG. 2. That is, the photodiodes 21 are arranged across the imaging surface (xy plane) in the horizontal direction x and the vertical direction y perpendicular to the horizontal direction x.

Each of the photodiodes 21 is provided with the corresponding pixel transistor Tr in a portion adjacent to the photodiode 21, as shown in FIG. 3.

Each of the photodiodes 21 has a grounded anode and is so configured that accumulated signal charge (electrons in this description) is read and outputted in the form of an electric signal by the pixel transistor Tr to a vertical signal line 27, as shown in FIG. 4.

Each of the photodiodes 21 receives incident light H incident as a subject image, performs photoelectric conversion to produce signal charge, and accumulates the signal charge, as shown in FIG. 5.

In this description, the incident light H incident through the front surface of the substrate 101 is received by the light receiving surface JS of the photodiode 21, as shown in FIG. 5. Above the light receiving surface JS of the photodiode 21 are provided the multilayer wiring layer 111, the passivation film 120, the planarization film 130, the color filter CF, the on-chip lens ML, and the antireflection film 150, as shown in FIG. 5. The photodiode 21 therefore receives the incident light H incident sequentially through the components described above and performs photoelectric conversion.

Each of the photodiodes 21 is provided in the substrate 101 made, for example, of a single-crystal silicon semiconductor material, as shown in FIG. 5. Specifically, the photodiode 21 includes an n-type charge accumulation area. A hole accumulation area (not shown) is so formed that dark current will not be produced at upper and lower interfaces of the n-type charge accumulation area. That is, the photodiode 21 has what is called an HAD (hole accumulated diode) structure.

Although not shown, the substrate 101 is provided with a pixel separator (not shown) that separates the plurality of pixels P from each other, and the photodiodes 21 are disposed in the areas separated by the pixel separator.

(b) Pixel Transistor Tr

The pixel transistor Tr is disposed at a plurality of locations corresponding to the plurality of pixels P shown in FIG. 2.

Each of the pixel transistors Tr includes the transfer transistor 22, the amplifier transistor 23, the selector transistor 24, and the reset transistor 25, reads signal charge from the photodiode 21, and outputs the signal charge in the form of an electric signal, as shown in FIGS. 3 and 4. For example, the pixel transistor Tr is positioned below the photodiode 21 in the imaging surface (xy plane), as shown in FIG. 3.

The transistors 22 to 25 that form the pixel transistor Tr are disposed in the front surface of the substrate 101, although not shown in FIG. 5. Each of the transistors 22 to 25 is, for example, an N-channel MOS transistor having a gate made, for example, of polysilicon. The transistors 22 to 25 are covered with the multilayer wiring layer 111.

(b-1) Transfer Transistor 22

In each of the pixel transistors Tr, the transfer transistor 22 transfers signal charge produced by the photodiode 21 to a floating diffusion node FD, as shown in FIGS. 3 and 4.

Specifically, the transfer transistor 22 is disposed between the cathode of the photodiode 21 and the floating diffusion node FD, as shown in FIGS. 3 and 4. A transfer line 26 is electrically connected to the gate of the transfer transistor 22. When a transfer signal TG is sent through the transfer line 26 to the gate of the transfer transistor 22, signal charge accumulated in the photodiode 21 is transferred to the floating diffusion node FD.

(b-2) Amplifier Transistor 23

In each of the pixel transistors Tr, the floating diffusion node FD converts the charge into voltage, and the amplifier transistor 23 amplifies the resultant electric signal and outputs the amplified signal, as shown in FIGS. 3 and 4.

Specifically, the amplifier transistor 23 is disposed between the selector transistor 24 and the reset transistor 25, as shown in FIG. 3. In this description, the gate of the amplifier transistor 23 is electrically connected to the floating diffusion node FD, as shown in FIG. 4. The drain of the amplifier transistor 23 is electrically connected to a power supply line Vdd, and the source of the amplifier transistor 23 is electrically connected to the selector transistor 24. The amplifier transistor 23 is supplied with fixed current from a fixed current source I and operates as a source follower when the selector transistor 24 is selected to be turned on. The amplifier transistor 23 therefore amplifies the electric signal from the floating diffusion node FD, which has converted the charge into voltage, when a selection signal is supplied to the selector transistor 24.

(b-3) Selector Transistor 24

In each of the pixel transistors Tr, the selector transistor 24, when receiving the selection signal, outputs the electric signal outputted from the amplifier transistor 23 to the vertical signal line 27, as shown in FIGS. 3 and 4.

Specifically, the selector transistor 24 is disposed adjacent to the amplifier transistor 23, as shown in FIG. 3. An address line 28, through which the selection signal is supplied, is connected to the gate of the selector transistor 24, as shown in FIG. 4. The selector transistor 24 is turned on when the selection signal is supplied thereto and outputs the output signal having been amplified by the amplifier transistor 23 as described above to the vertical signal line 27.

(b-4) Reset Transistor 25

In each of the pixel transistors Tr, the reset transistor 25 resets the potential of the gate of the amplifier transistor 23, as shown in FIGS. 3 and 4.

Specifically, the reset transistor 25 is disposed adjacent to the amplifier transistor 23, as shown in FIG. 3. A reset line 29, through which a reset signal is supplied, is electrically connected to the gate of the reset transistor 25, as shown in FIG. 4. The drain of the reset transistor 25 is electrically connected to the power supply line Vdd, and the source of the reset transistor 25 is electrically connected to the floating diffusion node FD. The reset transistor 25, when the reset signal is supplied to the gate thereof through the reset line 29, resets the potential of the gate of the amplifier transistor 23 to the power supply voltage via the floating diffusion node FD.

In the above description, the transfer line 26, the address line 28, and the reset line 29 are so wired that they are connected to the gates of the transistors 22, 24, and 25 associated with a plurality of pixels P arranged in the horizontal direction H (row direction). The transistors 22, 23, 24, and 25 described above associated with the pixels P corresponding to a single row therefore simultaneously operate.

(c) Multilayer Wiring Layer 111 (Including Pad Electrode 111P)

The multilayer wiring layer 111 is disposed on the front surface of the substrate 101, as shown in FIGS. 5 and 6.

The multilayer wiring layer 111 includes wiring lines 111*h* and an insulating layer 111*z*. In the insulating layer 111*z*, the wiring lines 111*h* are so formed that they are electrically connected to a variety of devices.

In this description, the wiring lines 111*h* are so formed and stacked in the pixel array area PA that they function as the transfer line 26, the address line 28, the vertical signal line 27, the reset line 29, and other lines shown in FIG. 4. The wiring lines 111*h* are disposed, for example, along the boundary between the pixels P and electrically connected via holes (not shown) as appropriate.

On the other hand, in the peripheral area SA, the pad electrodes 111P are provided on the multilayer wiring layer 111, as shown in FIG. 6. The pad electrodes 111P are so formed that they are electrically connected to wiring lines (not shown) in the uppermost layer of the multilayer wiring layer 111. The pad electrodes 111P are so provided in the peripheral area SA that they surround the pixel array area PA, as shown in FIG. 2.

Each of the pad electrodes 111P is made, for example, of aluminum (Al) as the wiring lines 111h are. The pad electrode 111P is not necessarily made of aluminum (Al) but may alternatively be made of an aluminum alloy containing, for example, silicon (Si) and copper (Cu). Further, titanium (Ti), titanium nitride (TiN), tantalum (Ta), tantalum nitride (TaN), titanium tungsten (TiW), tungsten nitride (WN), or any other refractory metal may be provided as a barrier metal portion above and below the aluminum or aluminum alloy portion.

An opening KK is provided above each of the pad electrodes 111P, as shown in FIG. 6. The opening KK is formed to expose the surface of the pad electrode 111P that is electrically connected to an external component. That is, a wire 502 is electrically connected to the exposed surface of the pad electrode 111P, as shown in FIG. 1, whereby the solid-state imaging device 1 is electrically connected to the substrate 501.

The carbon-based inorganic film 300 is then so provided that it covers part of the pad electrode 111P, as shown in FIG. 6.

(d) Carbon-based Inorganic Film 300

The carbon-based inorganic film 300 is provided on the surface of the pad electrode 111P but only on the portion where the opening KK is not provided, as shown in FIG. 6. That is, the opening KK is formed through the carbon-based inorganic film 300 in the portion corresponding to the surface of the pad electrode 111P that is electrically connected to an external component.

In the present embodiment, the carbon-based inorganic film 300 prevents the incident light H from being reflected off the surface of the pad electrode 111P. That is, the material and thickness of the carbon-based inorganic film 300 are so selected as appropriate that optical interference provides an antireflection function.

The carbon-based inorganic film 300, which will be described later in detail, is also used as an etching stopper film when the layers provided on the carbon-based inorganic film 300 are dry etched. In this description, in a dry etching process using a fluorine (F)-based gas, the carbon-based inorganic film 300, which is made of a material that unlikely reacts with activated fluorine (F) ions or radicals, functions as an etching stopper film.

The carbon-based inorganic film 300 is a film made of an inorganic material primarily containing carbon, specifically, at least one of graphite, graphene, carbon nanotubes, and diamond-like carbon (amorphous carbon).

Figure 7:
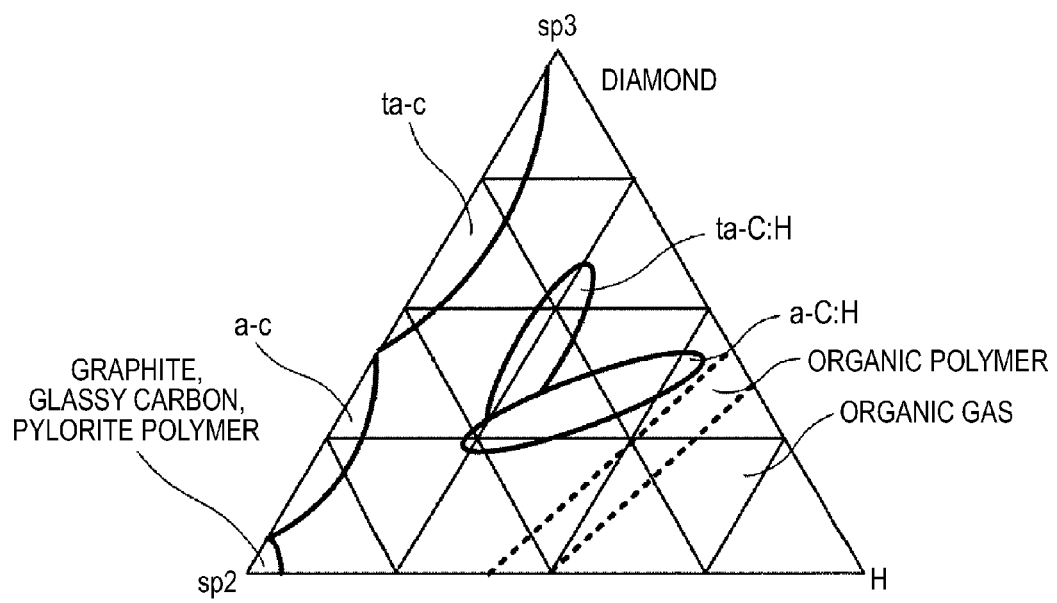
FIG. 7 shows classification of amorphous carbon films.

FIG. 7 shows classification of amorphous carbon films.

Figure 8A:
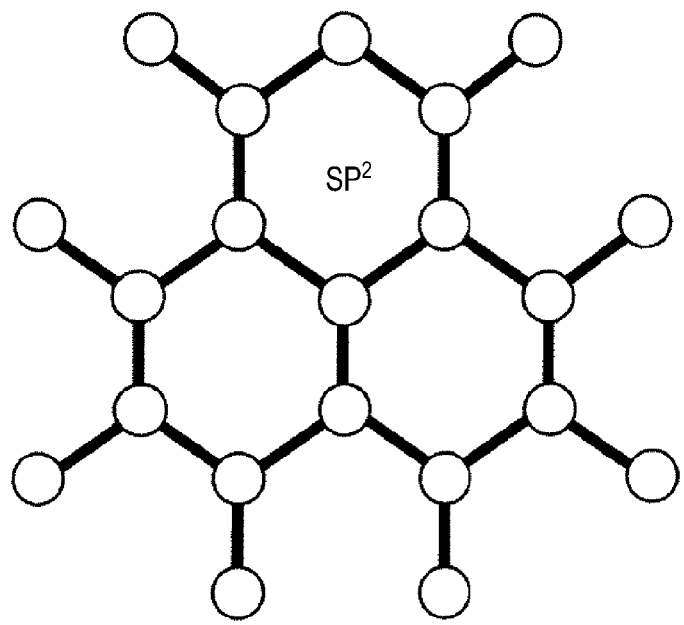
FIGS. 8A and 8B diagrammatically show the structures of carbon-based inorganic materials of which a carbon-based inorganic film is made in the embodiment according to the present disclosure.
Figure 8B:
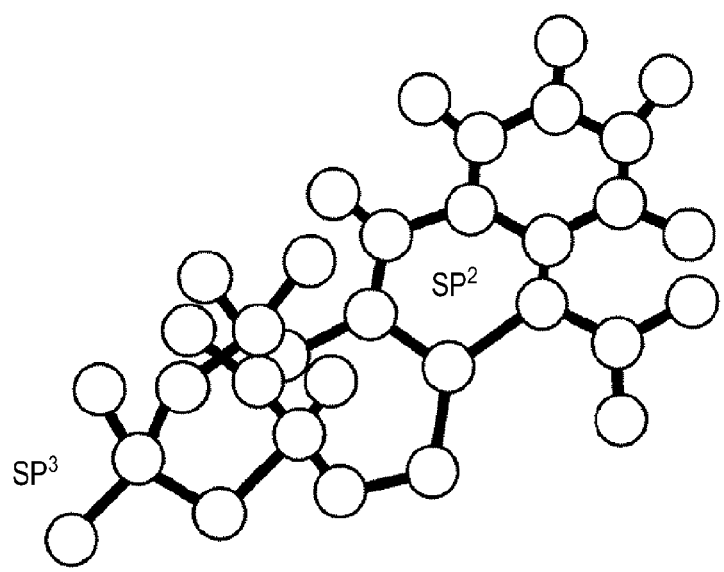

FIGS. 8A and 8B diagrammatically show the structures of carbon-based inorganic materials of which the carbon-based inorganic film 300 is made in the embodiment according to the present disclosure. FIG. 8A shows the structure of graphite, and FIG. 8B shows the structure of diamond-like carbon. In FIGS. 8A and 8B, a white circle represents a carbon (C) element, and a thick line represents the bond between carbon elements.

Graphite includes a layer having a crystal structure based on $sp^2$-bonded carbon elements, as shown in FIGS. 7 and 8A. In graphite, the layer is stacked multiple times, and Van der Waals attraction bonds the multiple layers to each other, whereby conductivity is achieved. Graphene does not include a plurality of layers formed of $sp^2$-bonded carbon elements but includes a $sp^2$-bonded monolayer having a thickness corresponding to only a single carbon atom. Graphene is therefore a two-dimensional material having excellent conductivity. A carbon nanotube is obtained by rolling a graphene sheet or graphene sheets to form a coaxially tubular material.

Diamond-like carbon (amorphous carbon) is non-crystalline carbon, which is not crystallized, and a mixture of a portion containing $sp^3$-bonded carbon elements and a portion containing $sp^2$-bonded carbon elements, as shown in FIGS. 7 and 8B.

When the carbon-based inorganic film 300 is made of diamond-like carbon, the proportion of $sp^3$-bonded carbon-carbon structure may be at least 5% of all carbon-carbon bonded structures.

In this description, it is particularly optimum to form the carbon-based inorganic film 300 with diamond-like carbon in which the proportion of $sp^3$-bonded carbon-carbon structures is at least 40% of all carbon-carbon bonded structures ($sp^3$ bond>$sp^2$ bond).

The reason for this is that when the number of $sp^3$ bonded structures is greater than the number of $sp^2$ bonded structures, the resultant material has high hardness, high transparency, and low conductivity.

Further, the carbon-based inorganic film 300 may be made of a material having a hydrogen (H) content of several percents (5%, for example) or lower.

The reason for this is that a material primarily containing carbon and a fairly large amount of hydrogen (H) element is an organic material, which reacts in the dry etching process and degrades the durability of the material, and hence is not suitably used as an etching stopper film.

The carbon-based inorganic film 300 is therefore preferably made of a-C or ta-C shown in FIG. 7. On the other hand, it is not preferable to form the carbon-based inorganic film 300 with a-C:H or ta-C:H shown in FIG. 7.

Further, among the materials primarily containing carbon shown in FIG. 7, glassy carbon is a bulk material, and pylorite carbon is a carbon precursor obtained by thermally decomposing an organic material and is not a thin film forming material. Glassy carbon or pylorite carbon is therefore not used to form the carbon-based inorganic film 300.

(e) Passivation Film 120

The passivation film 120 is provided on the multilayer wiring layer 111 in the pixel array area PA, as shown in FIG. 5.

In the peripheral area SA, the passivation film 120 is provided above the multilayer wiring layer 111 with the carbon-based inorganic film 300 therebetween, as shown in FIG. 6. The opening KK is formed through the passivation film 120 in the portion corresponding to the surface of the pad electrode 111P that is electrically connected to an external component.

The passivation film 120 is made, for example, of a silicon nitride ($Si_xN_y$). The passivation film 120 may be a monolayer made of a silicon nitride ($Si_xN_y$), or a silicon oxide ($SiO_2$) layer may be stacked thereon for stress relaxation.

(f) Planarization Film 130

The planarization film 130 is provided above the multilayer wiring layer 111 with the passivation film 120 therebetween in the pixel array area PA and the peripheral area SA, as shown in FIGS. 5 and 6. The planarization film 130 is made, for example, of a resin or any other suitable organic material.

The planarization film 130 is provided to planarize an irregular surface of the passivation film 120.

In the peripheral area SA, the opening KK is formed through the planarization film 130 in the portion corresponding to the surface of the pad electrode 111P that is electrically connected to an external component, as shown in FIG. 6, as in the case of the passivation film 120.

(g) Color Filter CF

The color filter CF is provided above the multilayer wiring layer 111 with the passivation film 120 and the planarization film 130 therebetween in the pixel array area PA, as shown in FIG. 5. The color filter CF, when provided on the surface planarized by the planarization film 130, is so formed that it precisely faces the light receiving surface JS of the photodiode 21. Further, the planarization film 130 ensures tight contact of the color filter CF.

No color filter CF is provided in the peripheral area SA, as shown in FIG. 6.

FIG. 9 shows the color filter CF in the embodiment according to the present disclosure. FIG. 9 is a top view of the color filter CF.

The color filter CF, which is provided to each of the plurality of pixels P as shown in FIG. 9, colors the incident light H and transmit the colored light toward the light receiving surface JS.

The color filter CF includes a red filter layer CFR, a green filter layer CFG, and a blue filter layer CFB, as shown in FIG. 9.

In the color filter CF, the red filter layer CFR has high optical transmittance across a wavelength band corresponding to red (625 to 740 nm, for example), colors the incident light H red, and transmits the colored light toward the light receiving surface JS. The green filter layer CFG has high optical transmittance across a wavelength band corresponding to green (500 to 565 nm, for example), colors the incident light H green, and transmits the colored light toward the light receiving surface JS. The blue filter layer CFB has high optical transmittance across a wavelength band corresponding to blue (450 to 485 nm, for example), colors the incident light H blue, and transmits the colored light toward the light receiving surface JS.

The red filter layer CFR, the green filter layer CFG, and the blue filter layer CFB are disposed adjacent to one another and correspond to the plurality of respective pixels P.

In this description, the red filter layer CFR, the green filter layer CFG, and the blue filter layer CFB are arranged in a Bayer layout, as shown in FIG. 9. That is, the green filter layers CFG are diagonally arranged in a checkered pattern. The red filter layers CFR and the blue filter layers CFB are then diagonally arranged with respect to the green filter layers CFG.

For example, each of the filter layers CFR, CFG, and CFB is formed, for example, by applying an application liquid containing a coloring pigment and a photoresist resin by using spin coating or any other coating method to form a coated film and patterning the coated film by using lithography.

As described above, the color filter CF transmits light fluxes having different colors in such a way that adjacent pixels P arranged in the horizontal direction x and the vertical direction y receive the different-color light fluxes.

The color filter CF is not necessarily an RGB primary color filter but may alternatively be a complementary color filter formed of yellow, magenta, cyan filter layers.

(h) On-Chip Lens ML and Lens Material Layer 140

The on-chip lenses ML are provided above the multilayer wiring layer 111 with the passivation film 120, the planarization film 130, and the color filter CF therebetween in the pixel array area PA, as shown in FIG. 5. The on-chip lenses ML are so provided that they correspond to the pixels P in the pixel array area PA and are formed by processing the lens material film 140.

Each of the on-chip lenses ML is a convex lens protruding convexly upward and focuses the incident light H on the corresponding photodiode 21. That is, each of the on-chip lenses ML is so formed that the thickness at the center is greater than the thickness at the edge in a direction z perpendicular to the light receiving surface JS.

No on-chip lens ML is provided in the peripheral area SA, and the lens material film 140, which forms the on-chip lenses ML in the pixel array area PA, is provided above the multilayer wiring layer 111 with the passivation film 120 and the planarization film 130 therebetween, as shown in FIG. 6. The opening KK is formed through the lens material film 140 in the portion corresponding to the surface of the pad electrode 111P that is electrically connected to an external component.

For example, the on-chip lenses ML and the lens material film 140 are made of a resin or any other suitable organic material.

In the above description, the on-chip lenses ML are directly formed on the color filter CF but are not necessarily formed this way. When the formation of the color filter CF produces large steps, another planarization film (not shown) may be provided to planarize the steps, and the on-chip lenses ML may be formed on the thus planarized surface. Further, in the above description, the on-chip lenses ML are so formed that the center of each of the on-chip lenses ML coincides with the center of the corresponding light receiving surface JS but the on-chip lenses ML are not necessarily formed this way.

(i) Antireflection Film 150

The antireflection film 150 is so provided that it covers the upper surfaces of the on-chip lenses ML and the lens material film 140 in the pixel array area PA, as shown in FIG. 5.

In the peripheral area SA, the antireflection film 150 is so provided that it covers the upper surface of the lens material film. 140, as shown in FIG. 6. The opening KK is formed through the antireflection film 150 in the portion corresponding to the surface of the pad electrode 111P that is electrically connected to an external component.

The antireflection film 150 prevents the incident light H from being reflected off the surfaces of the on-chip lenses ML and the lens material film 140, as shown in FIGS. 5 and 6. That is, the material and thickness of the antireflection film 150 is so selected as appropriate that optical interference provides an antireflection function.

In general, the antireflection film 150 is made of a material having a refractive index lower than that of the on-chip lenses ML. For example, the antireflection film 150 is made of a silicon oxide (refractive index n=1.4). The antireflection film 150 may alternatively be formed by stacking a plurality of layers having different refractive indices. The antireflection film 150 can be formed as appropriate in consideration of desired performance, cost, and other factors.

(j) Others

FIGS. 10A to 10C are timing charts illustrating pulse signals supplied to relevant components when a signal is read from a pixel P in the embodiment according to the present disclosure. FIG. 10A shows the selection signal (SEL) inputted to the gate of the selector transistor 24. FIG. 10B shows the reset signal (RST) inputted to the gate of the reset transistor 25. FIG. 10C shows the transfer signal (TG) inputted to the gate of the transfer transistor 22 (see FIG. 4).

As shown in FIGS. 10A to 10C, the selection signal (SEL) is first changed from a low level to a high level at a first point of time t1so that the selector transistor 24 (see FIG. 4) is turned on. The reset signal (RST) is then changed from a low level to a high level at a second point of time t2 so that the reset transistor 25 (see FIG. 4) is turned on, which resets the potential of the gate of the amplifier transistor 23 (see FIG. 4).

The reset signal (RST) is then changed from the high level to the low level at a third point of time t3 so that the reset transistor 25 is turned off. A voltage corresponding to the reset level is then read as an output signal, which is sent to the column circuit (not shown).

The transfer signal (TG) is then changed from a low level to a high level at a fourth point of time t4 so that the transfer transistor 22 is turned on, which allows signal charge accumulated in the photodiode 21 to be transferred to the gate of the amplifier transistor 23.

The transfer signal (TG) is then changed from the high level to the low level at a fifth point of time t5 so that the transfer transistor 22 is turned off. A voltage corresponding to a signal level according to the amount of the accumulated signal charge is then read as an output signal, which is sent to the column circuit (not shown).

In the column circuit (not shown), the reset level having been read earlier and the signal level having been read later undergo a subtraction process, and the resultant signal is accumulated. In this way, fixed pattern noise resulting, for example, from variation in Vth of each of the transistors associated with each of the pixels P is canceled.

As described above, the pixels P arranged in each row in the horizontal direction x are simultaneously driven because the gates of the transistors 22, 24, and 25 associated with the pixels P are connected on a row basis. That is, the pixels P are sequentially selected in the vertical direction on a horizontal line (pixel row) basis.

The variety of timing signals then control the transistors associated with each of the pixels P, whereby an output signal from the pixel P is read to the column circuit (not shown) via the vertical signal line 27. This operation is performed on a column basis. The signals accumulated in the column circuit (not shown) are then sequentially selected by the horizontal drive circuit (not shown) and outputted to the external output circuit (not shown).

(B) Manufacturing Method

Key steps of a method for manufacturing the solid-state imaging device 1 described above will be described below.

FIGS. 11A, 11B, 12C, 12D, and 13E show a key portion formed in steps in the method for manufacturing the solid-state imaging device 1 in the embodiment of the present disclosure.

FIGS. 11A, 11B, 12C, 12D, and 13E sequentially show steps (a), (b), (c), (d), and (e) of exposing part of the surface of a pad electrode 111P in the solid-state imaging device 1. Each of the figures is a cross-sectional view showing the portion of the peripheral area SA of the solid-state imaging device 1 where the pad electrode 111P is formed. That is, each of the figures is a cross-sectional view taken along the line X1b-X2b shown in FIG. 2, as in FIG. 6. Further, each of the figures selectively shows a portion above the portion where the pad electrode 111P is formed.

(a) Formation of Pad Electrode 111P and Other Components

The pad electrode 111P and other components are first formed, as shown in FIG. 11A.

In the following description, the pad electrodes 111P are provided in the peripheral area SA, as shown in FIG. 11A. Specifically, after a metal film is formed, the metal film is patterned to form the pad electrodes 111P. The carbon-based inorganic film 300 is then so provided that it covers the upper surface of each of the pad electrodes 111P. The passivation film 120, the planarization film 130, the lens material film 140, and the antireflection film 150 are then sequentially so provided on the upper surfaces of the pad electrodes 111P that they cover the pad electrodes 111P.

The components described above are formed, for example, under the following conditions.

[Pad Electrode 111P]
material: aluminum or aluminum alloy
thickness: 300 to 1200 nm (depending on device performance)

[Carbon-Based Inorganic Film 300]
material: graphite, graphene, carbon nanotube, or diamond-like carbon (amorphous carbon)
thickness: 10 to 50 nm (or thickness corresponding to a single carbon element when graphene is used)

[Passivation Film 120]
material: silicon nitride ($Si_xN_y$) or any other suitable material
thickness: 200 to 800 nm (depending on composition)

[Planarization Film 130]
material: acrylic resin or epoxy resin
thickness: 50 to 800 nm (depending on composition, material, and shape)

[Lens Material Film 140]
material: acrylic resin or epoxy resin
thickness: 200 to 2000 nm (depending on composition and material)

[Antireflection Film 150]
material: silicon oxide ($SiO_2$) or any other suitable material
thickness: 50 to 250 nm (depending on composition and material)

Although not shown in FIG. 11A, the wiring lines 111h in the uppermost layer are formed in the pixel array area PA as well as the pad electrode 111P, as shown in FIG. 5. After the passivation film 120 and the planarization film 130 are formed, the color filter CF is formed on the upper surface of the planarization film 130. After the lens material film 140 is then so formed that it covers the color filter CF, part of the lens material film 140 is processed into the on-chip lenses ML. The on-chip lenses ML are formed, for example, by using a reflow method, an etch-back method, an imprint method, or any other suitable forming method. Thereafter, the antireflection film 150 is so provided that it covers the on-chip lenses ML and the lens material film 140.

(b) Formation of Photoresist Film PR

The photoresist film PR is then formed, as shown in FIG. 11B.

In this description, a photoresist film PR is formed by using spin coating to apply a photoresist material in such a way that it covers the upper surface of the antireflection film 150, as shown in FIG. 11B.

(c) Formation of Resist Pattern RP

A resist pattern RP is then formed, as shown in FIG. 12C.

In this description, the resist pattern RP is formed by patterning the photoresist film PR (see FIG. 11B). Specifically, the resist pattern RP is formed by providing an opening KK1 above the portion of the upper surface of each of the pad electrodes 111P that is exposed (see FIG. 6).

For example, the resist pattern RP is so formed that the side surface of the opening KK1 is perpendicular to the imaging surface (xy plane) as shown in FIG. 12C. The resist pattern RP may alternatively be so formed that the side surface of the opening KK1 is inclined or tapered with respect to the imaging surface (xy plane). When a plurality of films are etched, the resist pattern RP preferably has tapered openings because the resultant shape thereof has a relatively small amount of side etching.

(d) Etching of Components Provided on Upper Surface of Carbon-Based Inorganic Film 300

The components provided on the upper surface of each of the carbon-based inorganic films 300 are then etched until part of the surface of the carbon-based inorganic film 300 is exposed, as shown in FIG. 12D.

In this description, the resist pattern RP is used as a mask to remove the antireflection film 150, the lens material film 140, the planarization film 130, and the passivation film 120 in a dry etching process so that part of the surface of the carbon-based inorganic film 300 is exposed.

For example, the components described above are dry etched by using a fluorine (F)-based etching gas containing at least one of $CF_4$, $C_2F_6$, $C_3F_8$, $CHF_3$, and $SF_6$. The dry etching may be performed with oxygen (O), argon (Ar), and any other suitable gas introduced as appropriate. The gases described above are converted into plasma to form active ions or radicals, which chemically react with the antireflection film 150 and other films to be etched, whereby the film are etched.

In the thus performed dry etching process, the antireflection film 150, the lens material film 140, the planarization film 130, and the passivation film 120 are etched. That is, portions of the antireflection film 150, the lens material film 140, the planarization film 130, and the passivation film 120 that correspond to the bottom of the opening KK1 (see FIG. 12C) formed through the resist pattern RP are removed, whereby an opening KK2 is formed through the components described above.

For example, the dry etching is performed by using an ICP etcher under the following conditions.
  gas pressure: 0.3 to 2.0 Pa
  gas flow rate:
    $O_2$: 50 to 500 scc
    $CHF_3$: 0 to 50 scc
    $CF_4$: 30 to 400 scc
    Ar: 0 to 30 scc
  discharge (plasma) power: 500 to 2000 W
  bias power: 20 to 500 W The carbon-based inorganic film 300 under the passivation film 120 is etched at an extremely slow rate in the dry etching process. The carbon-based inorganic film 300 therefore functions as an etching stopper, whereby the dry etching will not proceed farther.

In the dry etching process described above, the plurality of films to be etched may be removed all together or separately.

To further increase etching precision in the dry etching process described above, it is preferable to detect an endpoint by using an end point detector (EPD). The films located above the carbon-based inorganic film 300 so that they are etched are made, for example, of inorganic silicon nitrides. It is therefore possible to detect an end point accurately and terminate the dry etching process by monitoring light emitted from a silicon-based gas resulting from the films to be etched.

(e) Removal of Resist Pattern RP and Part of Carbon-Based Inorganic Film 300

Figure 13E:
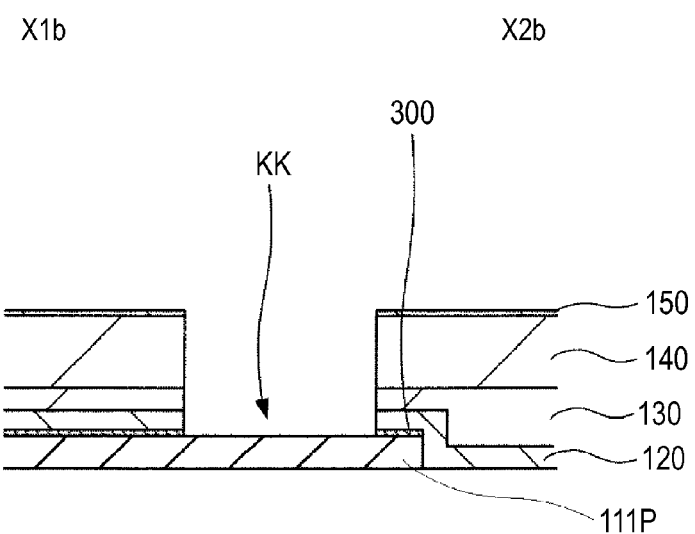
FIG. 13E shows the key portion formed in a step in the method for manufacturing the solid-state imaging device in the embodiment of the present disclosure.

The resist pattern RP and part of the carbon-based inorganic film 300 are then removed, as shown in FIG. 13E.

In this description, the resist pattern RP is removed from the upper surface of the antireflection film 150 by performing $O_2$ plasma-based ashing. Part of the carbon-based inorganic film 300 is removed simultaneously with the resist pattern RP.

Specifically, the carbon-based inorganic film 300 is removed from part of the surface of the pad electrode 111P in accordance with the following reactions, whereby the opening KK is formed through the carbon-based inorganic film 300.

$$C + O^* \rightarrow CO \tag{3}$$

$$C + 2O^* \rightarrow CO_2 \tag{4}$$

As a result, the pad electrode 111P is exposed in the portion where the opening KK has been formed.

Thereafter, the wires 502 are electrically connected to the exposed surfaces of the pad electrodes 111P, as shown in FIG. 1, whereby the solid-state imaging device 1 is electrically connected to the substrate 501.

(C) Overview

As described above, in the present embodiment, the pixels P, which receive the incident light H, are formed in the pixel array area PA of the substrate 101 (pixel formation step). Further, the pad electrodes 111P are formed in the peripheral area SA located around the pixel array area PA of the substrate 101 (pad electrode formation step). In the present embodiment, the pad electrodes 111P are made of aluminum or an aluminum alloy. The carbon-based inorganic film 300 is then formed on the upper surface of each of the pad electrodes 111P including the connection surface electrically connected to an external component (carbon-based inorganic film formation step). In the present embodiment, the carbon-based inorganic film 300 is made of at least one of graphite, graphene, carbon nanotube, and diamond-like carbon (amorphous carbon). The passivation film 120, the planarization film 130, the lens material film 140, the antireflection film 150, and other coated films are then so formed that they cover the upper surfaces of the carbon-based inorganic films 300 (coated film formation step) (see FIG. 11A). Thereafter, the opening KK is formed above the connection surface of each of the pad electrodes 111P to expose the connection surface (opening formation step) (see FIGS. 11B to 13E).

In the present embodiment, to form the openings KK, the resist pattern RP is first formed (resist pattern formation step). In the present embodiment, the resist pattern RP is so formed on the upper surface of the antireflection film 150 that the resist pattern RP has openings corresponding to the connection surfaces of the pad electrodes 111P and covers portions other than the connection surfaces (see FIGS. 11B and 12C). The resist pattern RP is then used as a mask and the carbon-based inorganic films 300 are used as etching stopper films to etch the antireflection film 150 and other coated films. The portions of the upper surfaces of the carbon-based inorganic films 300 that correspond to the connection surfaces of the pad electrodes 111P are thus exposed (etching step) (see FIG. 12D). In the present embodiment, the etching is performed by using a fluorine (F)-based etching gas containing at least one of $CF_4$, $C_2F_6$, $C_3F_8$, $CHF_3$, and $SF_6$. Ashing is then performed on the resist pattern RP and the portions of the carbon-based inorganic films 300 that correspond to the connection surfaces of the pad electrodes 111P so that they are simultaneously removed (ashing step) (see FIG. 13E).

As described above, in the present embodiment, since the connection surfaces, which will be exposed, of the pad electrodes 111P are covered with the carbon-based inorganic films 300 in the dry etching process, the fluorine (F)-based etching gas does not directly come into contact with the connection surfaces to be exposed. As a result, no compound ($AlF_x$) of aluminum and fluorine (F) is produced on the connection surfaces of the pad electrodes 111P, whereby the connection surfaces of the pad electrodes 111P are not contaminated.

In the present embodiment, the connection surface of each of the pad electrodes 111P therefore adequately establishes ohmic contact with an electricity supplying metal configured as a connection means, such as wire bonding, whereby the solid-state imaging device operates normally.

Further, in the present embodiment, it is unnecessary to clean the connection surfaces of the pad electrodes 111P. In addition to this, in the present embodiment, ashing can be performed to simultaneously remove the resist pattern RP and the portions of the carbon-based inorganic films 300 that correspond to the connection surfaces of the pad electrodes 111P. Moreover, in the present embodiment, when the dry etching is performed, an end point in the dry etching process is detected by monitoring a gas produced when the antireflection film 150 and other coated films are etched. The device can therefore be efficiently manufactured in the present embodiment.

Further, in the present embodiment, the carbon-based inorganic film 300 is formed on the upper surface of each of the pad electrodes 111P other than the connection surface electrically connected to an external component. The carbon-based inorganic film 300 is provided to prevent the incident light H from being reflected off the surface of the pad electrode 111P. In the present embodiment, the quality of captured images can therefore be improved.

The above advantageous effect will be described with reference to the drawings.

Figure 14:
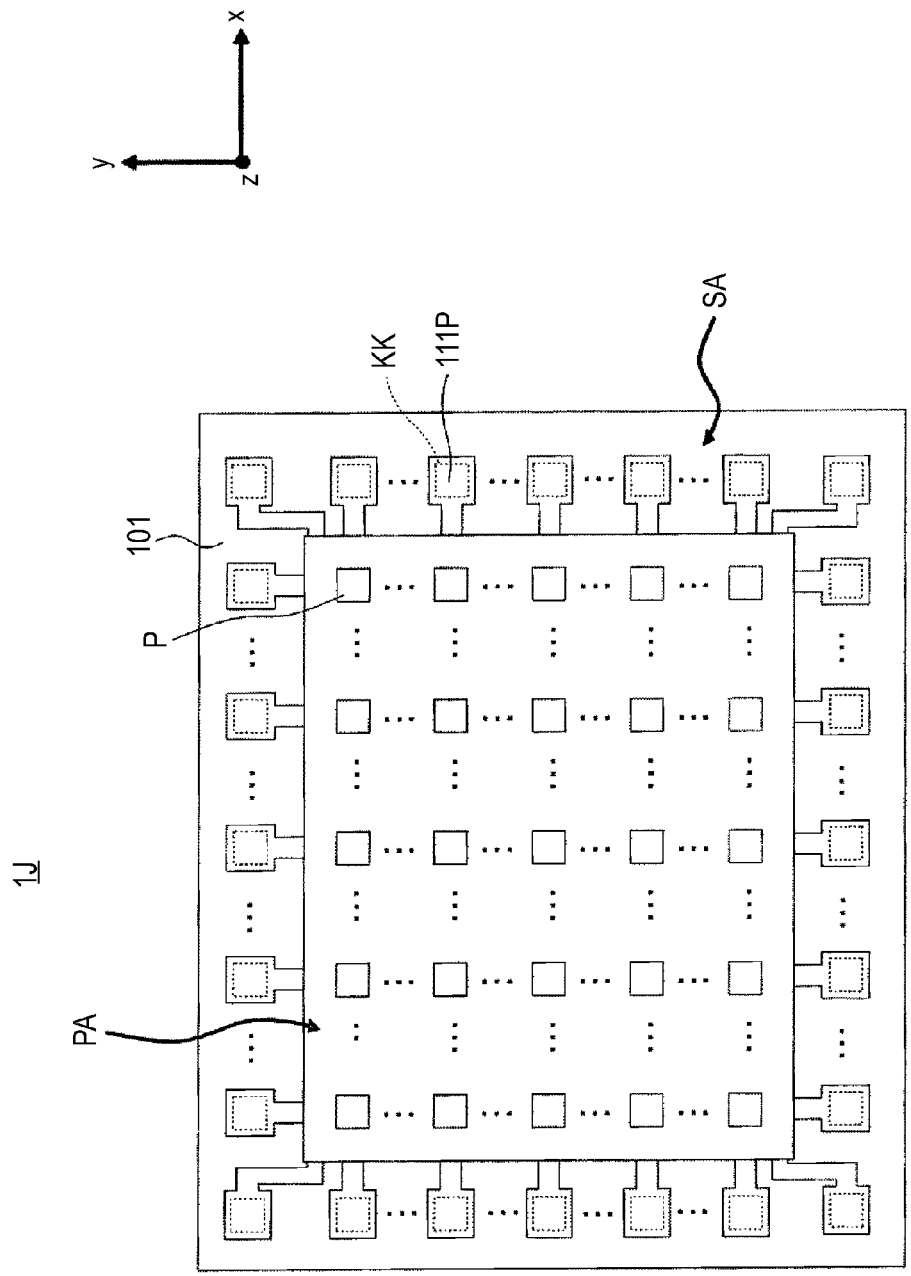
FIG. 14 shows an overall configuration of a solid-state imaging device with no carbon-based inorganic film provided on the surface of each pad electrode.

FIG. 14 shows an overall configuration of a solid-state imaging device 1J with no carbon-based inorganic film 300 provided on the surface of each of the pad electrodes 111P. FIG. 14 is a top view, as in FIG. 2.

Figure 15A:
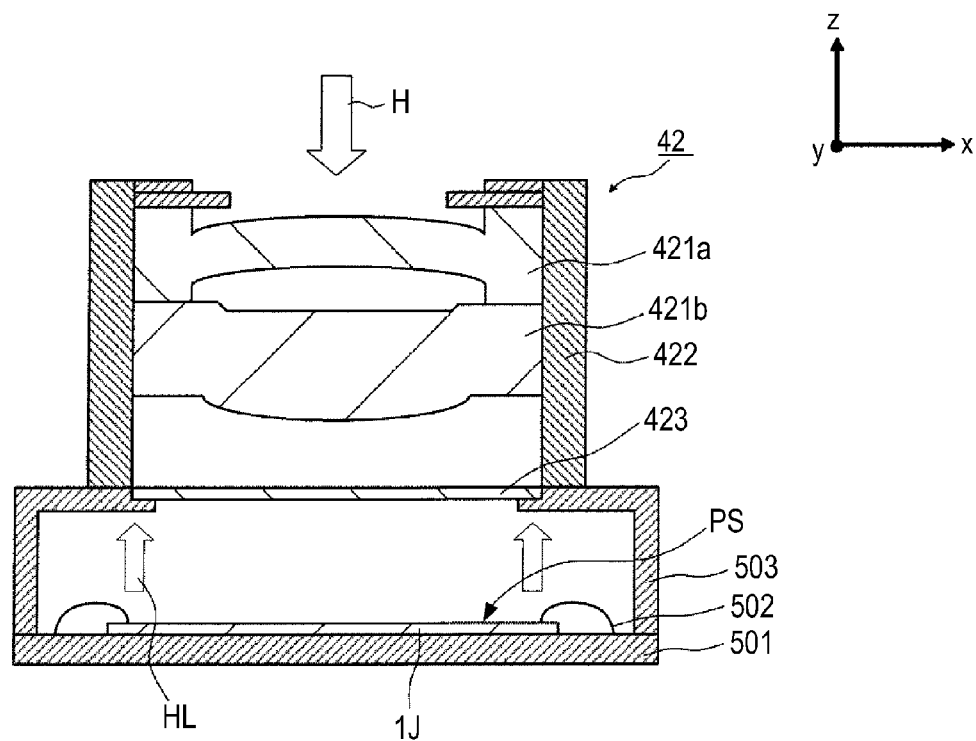
FIGS. 15A and 15B diagrammatically show states in which incident light H is incident on the two types of solid-state imaging device.
Figure 15B:
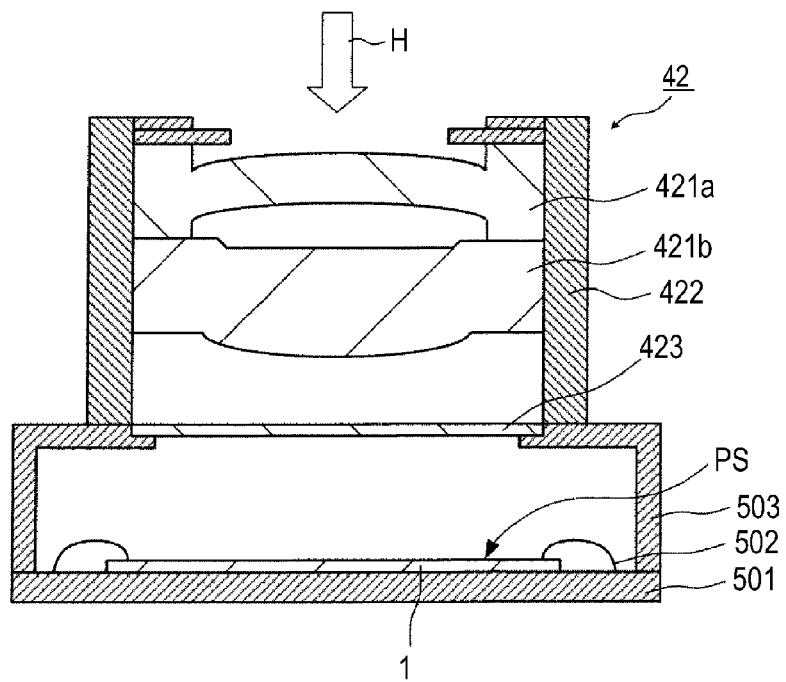
Figure 17A:
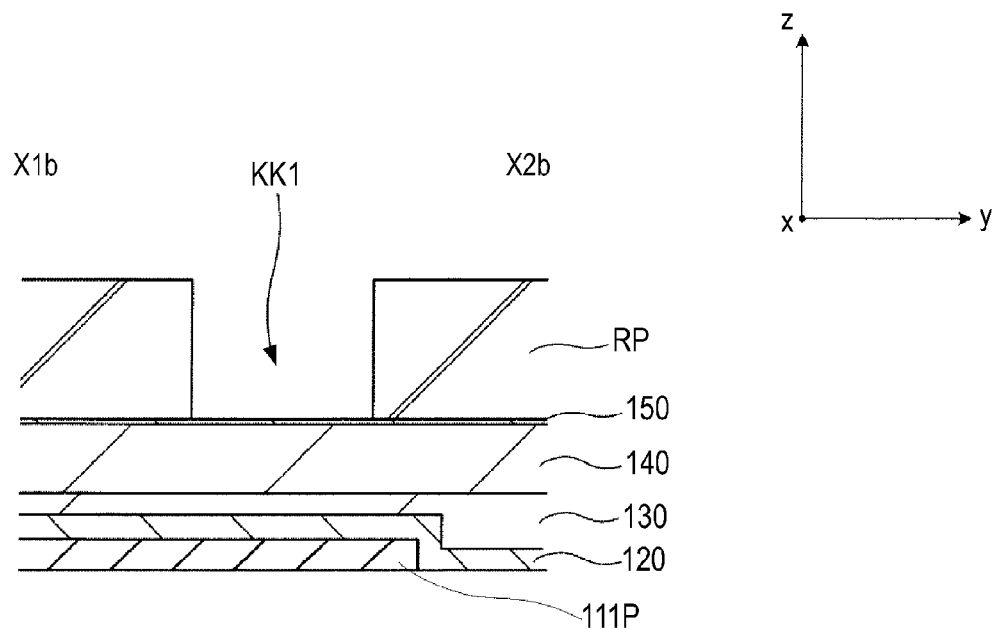
FIGS. 17A and 17B show key steps of manufacturing a solid-state imaging device.
Figure 17B:
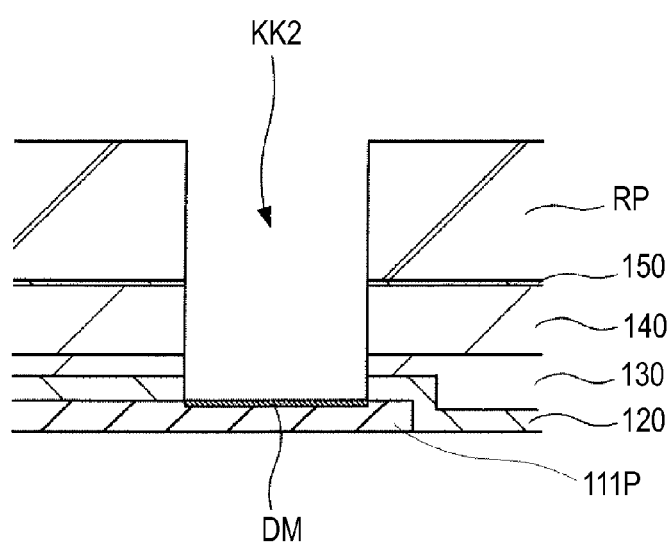
Figure 18C:
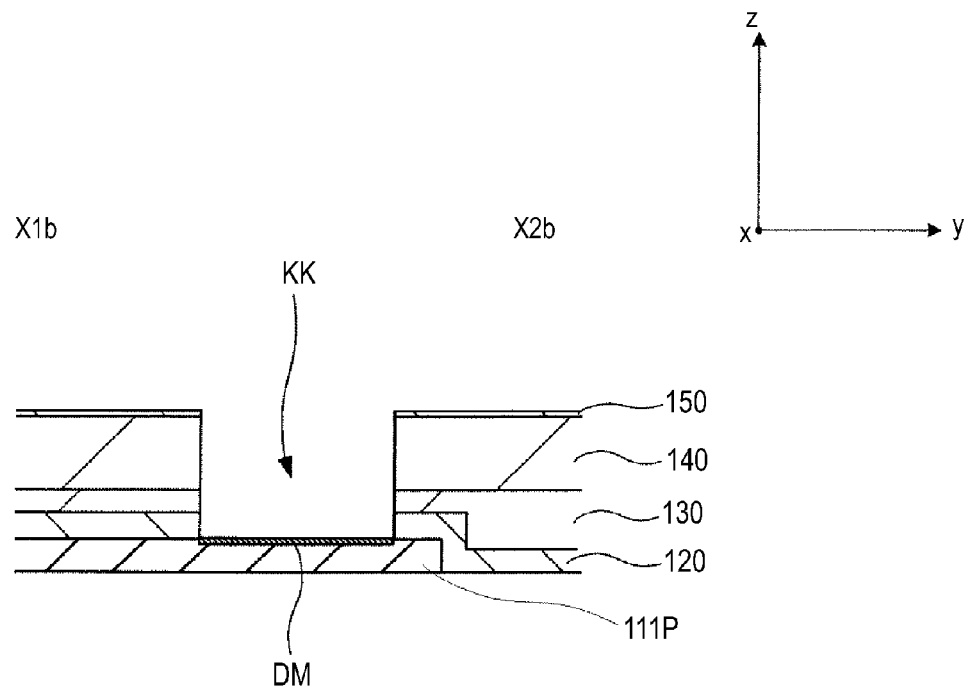
FIGS. 18C and 18D show other key steps of manufacturing the solid-state imaging device.
Figure 18D:
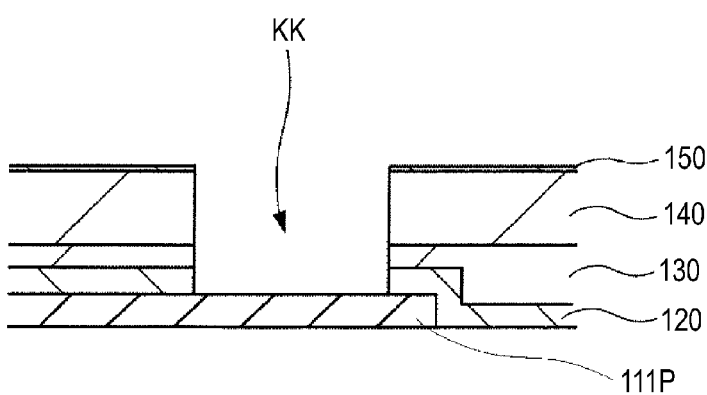
Figure 19A:
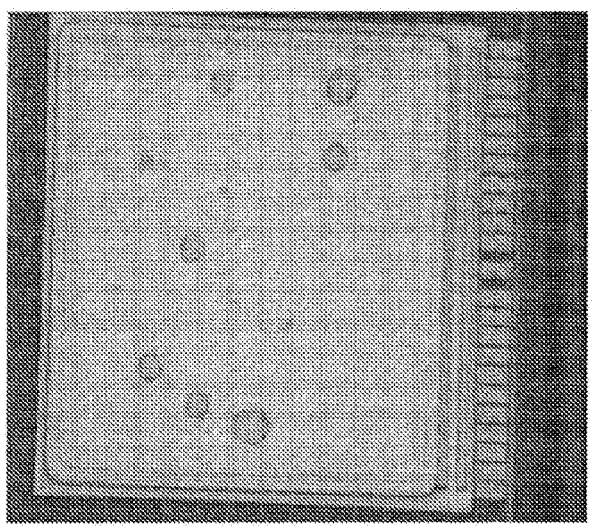
FIGS. 19A to 19C show the surface of a pad electrode resulting from improper cleaning.
Figure 19B:
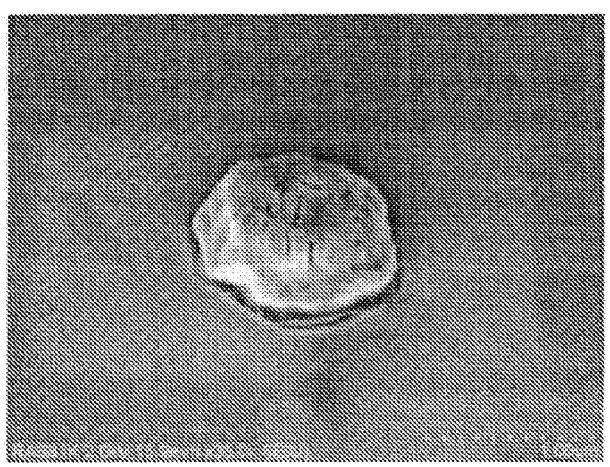
Figure 19C:
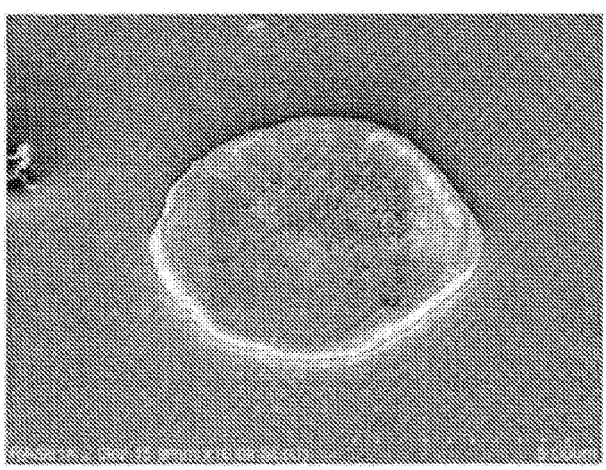
Figure 20A:
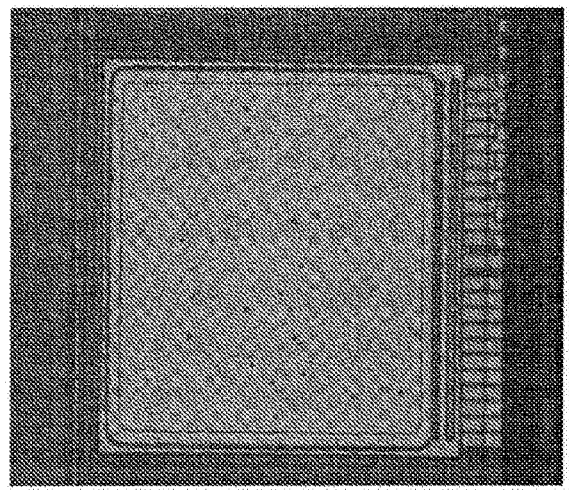
FIGS. 20A to 20C show temporal change in the surface of the pad electrode.
Figure 20B:
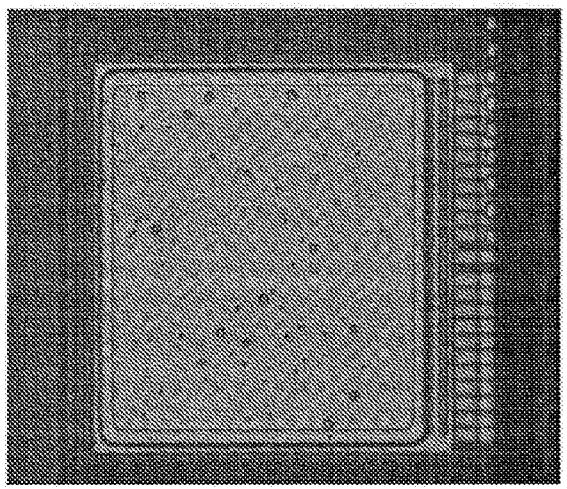
Figure 20C:
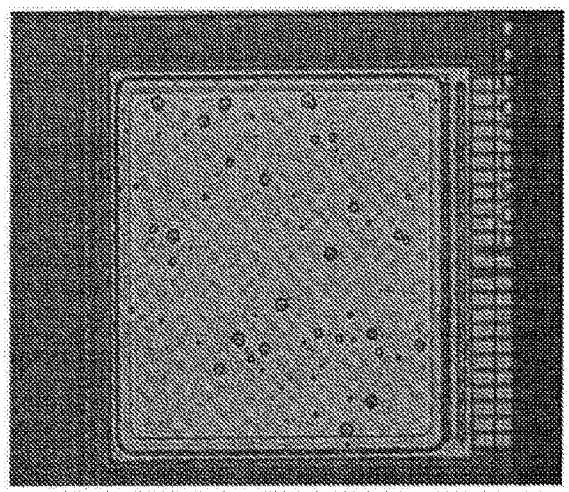
Figure 21A:
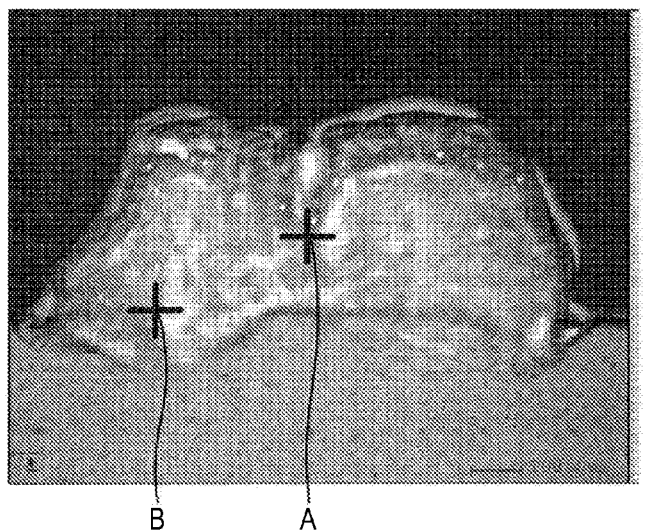
FIGS. 21A to 21C show results of component analysis made on a contaminant.
Figure 21B:
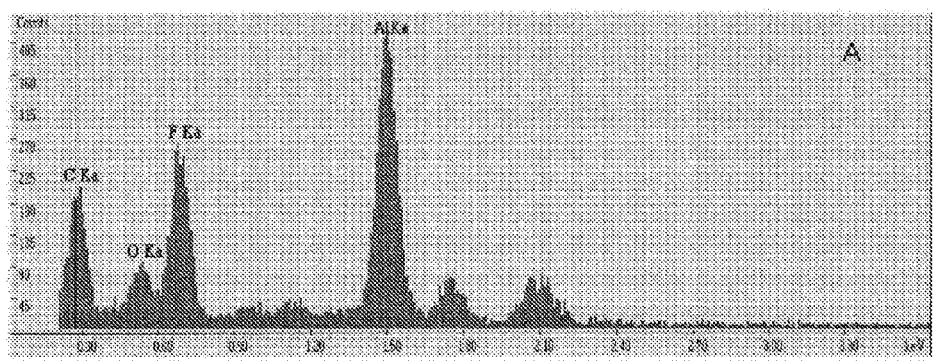
Figure 21C:
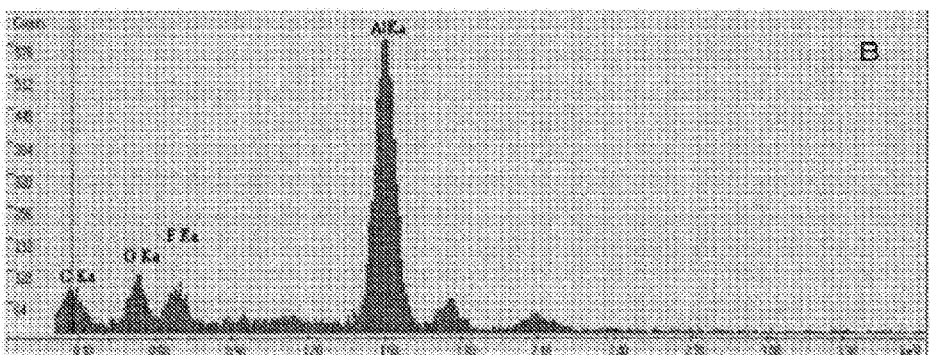

FIGS. 15A and 15B diagrammatically show states in which the incident light H is incident on the two types of solid-state imaging device. FIG. 15A shows a state in which the incident light H is incident on the solid-state imaging device 1J (the one shown in FIG. 14) with no carbon-based inorganic films 300 provided on the surface of each of the pad electrodes 111P. In contrast, FIG. 15B shows a state in which the incident light H is incident on the solid-state imaging device 1 (the one according to the present embodiment shown in FIG. 2) with the carbon-based inorganic films 300 provided on the surface of each of the pad electrodes 111P.

When no carbon-based inorganic film 300 covers each of the pad electrodes 111P as shown in FIG. 14, the incident light H is reflected off the pad electrodes 111P, as shown in FIG. 15A. In this case, what is called a ghost phenomenon may therefore occur, and the quality of captured images may be degraded in some cases.

In contrast, when the carbon-based inorganic films 300 cover the pad electrodes 111P in the solid-state imaging device 1 according to the present embodiment, the incident light H will not be reflected off the pad electrodes 111P, as shown in FIG. 15B.

In the present embodiment, what is called a ghost phenomenon will therefore not occur, whereby the quality of captured images can be improved.

The carbon-based inorganic films 300 are preferably made of graphite or any other suitable conductive material. In this case, no "electro-migration phenomenon" will occur in the pad electrodes 111P, whereby the reliability of the wiring can be improved.

The above advantageous effect will be described with reference to the drawings.

FIG. 16 diagrammatically shows a state in which current flows through a pad electrode 111P in the embodiment according to the present disclosure. FIG. 16 is a cross-sectional view taken along the line X1b-X2b shown in FIG. 2, as in FIG. 6, and shows the portion where the pad electrode 111P is formed in the peripheral area SA of the solid-state imaging device 1. FIG. 16 selectively shows a portion above the portion where the pad electrode 111P is formed in FIG. 6.

As shown in FIG. 16, a wire 502 is bonded to the surface of the pad electrode 111P that has been exposed through the opening KK, and current supplied through the wire 502 flows through the pad electrode 111P.

In this case, "electro-migration phenomenon", in which aluminum atoms that form the pad electrode 111P collide with electrons and the moved aluminum atoms cause disconnection, may occur in some cases. The "electro-migration phenomenon" typically tends to occur at the interface between an insulating object and the pad electrode 111P because the activation energy there is low. In the present embodiment, however, the conductive carbon-based inorganic film 300 is provided between the pad electrode 111P and the insulating passivation film 120. As a result, not only does the current spread, but also the pad electrode 111P is not in direct contact with the insulating passivation film 120. In the present embodiment, no "electro-migration phenomenon" will therefore occur, whereby the reliability of the wiring can be improved.

Further, in the present embodiment, since the carbon-based inorganic film 300 is provided on the upper surface of each of the pad electrodes 111P, no "stress-migration phenomenon" will occur, whereby the reliability of the wiring can be improved.

When a force acts on any of the pad electrodes 111P made of aluminum or any other metallic material, the pad electrode 111P may break due to shear stress in some cases ("electro-migration phenomenon"). In the present embodiment, however, the carbon-based inorganic film 300 functions as a buffer layer on the upper surface of each of the pad electrodes 111P, whereby no force directly acts on the pad electrode 111P. In the present embodiment, no "stress-migration phenomenon" will therefore occur, whereby the reliability of the wiring can be improved.

In addition to the above, when the carbon-based inorganic films 300 are made of diamond-like carbon or any other material having high heat conductivity, heat generated in the solid-state imaging device 1 is efficiently transferred to the substrate 501 (see FIG. 1 and other figures). The reliability of the wiring can therefore be improved.

In the present embodiment, to remove the carbon-based inorganic film 300 from part of the surface of each of the pad electrodes 111P, an $O_2$ plasma-based ashing step is carried out. $O_2$ plasma makes the front surface of a semiconductor wafer hydrophilic. In the following rear surface polishing step, in which a front surface protective tape that protects the front surface of the wafer is first removed, the hydrophilic front surface of the wafer allows the front surface protective tape to be readily separated and the amount of residual adhesive resulting from the front surface protective tape to be greatly reduced. Since the amount of residual adhesive can be greatly reduced, the yield of the device can be improved.

Further, when the $O_2$ plasma-based ashing is performed, the surface of each of the pad electrodes (made of aluminum or aluminum alloy) is oxidized. The oxidized surface does not allow oxidation on the aluminum crystal grains to proceed but allows oxidation at the grain boundary to proceed. The progress of oxidation at the grain boundary reinforces the grain boundary. In the following chip fragmentation step, in which the wafer is immersed in low specific resistivity pure water for a long period, the aluminum alloy containing copper (Cu), titanium (Ti), silver (Ag), silicon (Si), and other heterogeneous metals corrode due to a battery effect. That is, any base metal melts. For example, when copper and aluminum are contained, aluminum melts because aluminum is a base metal. In the present embodiment, since the $O_2$ plasma-based ashing step is the last wafer processing step, any of the heterogeneous metals or an alloy of the aluminum and any of the heterogeneous metals that is excessive and deposits along the grain boundary forms a thick oxide film. That is, since the thick oxide film prevents the aluminum alloy from coming into contact with the pure water, no battery effect or corrosion occurs. As a result, a wire is bonded to the electrode in a more satisfactory manner, whereby the reliability thereof is improved in the present embodiment.

To carry out the present disclosure, the embodiment described above is not necessarily employed, but any other variety of variations can be employed.

For example, a light guide (not shown) may be provided between the light receiving surface JS of each of the photodiodes 21 and the corresponding on-chip lens ML. The incident light H focused by the on-chip lens ML is guided through the light guide to the light receiving surface JS. In this case, a film made of a material of which the light guide is made may be formed, and the film made of the material of which the light guide is made in the peripheral area SA may be dry etched when the openings KK are formed.

Further, the above embodiment has been described with reference to the case where the pixel transistor is formed of the four transistors, the transfer transistor, the amplifier transistor, the selector transistor and the reset transistor, but the pixel transistor is not necessarily formed this way.

Further, the above embodiment has been described with reference to the case where the solid-state imaging device is a CMOS image sensor, but the solid-state imaging device is not limited to a CMOS image sensor but may be a CCD image sensor.

Further, the above embodiment has been described with reference to the case where the present disclosure is applied to a camera. The present disclosure is also applicable to other apparatus. For example, the present disclosure may be applicable to a scanner, a copier, and other electronic apparatus including a solid-state imaging device.

In the embodiment described above, the solid-state imaging device 1 corresponds to the solid-state imaging device according to the present disclosure. Further, in the embodiment described above, the pixels P correspond to the pixels according to the present disclosure. Further, in the embodiment described above, the substrate 101 corresponds to the substrate according to the present disclosure. Further, in the embodiment described above, the pixel array area PA corresponds to the pixel array area according to the present disclosure. Further, in the embodiment described above, the peripheral area SA corresponds to the peripheral area according to the present disclosure. Further, in the embodiment described above, the pad electrodes 111P correspond to the pad electrodes according to the present disclosure. Further, in the embodiment described above, the carbon-based inorganic films 300 correspond to the carbon-based inorganic films according to the present disclosure. Further, in the embodiment described above, the passivation film 120, the planarization film 130, the lens material film 140, and the antireflection film 150 correspond to the coated films according to the present disclosure. Further, in the embodiment described above, the resist pattern RP corresponds to the resist pattern according to the present disclosure. Further, in the embodiment described above, the passivation film 120 corresponds to the passivation film according to the present disclosure. Further, in the embodiment described above, the planarization film 130 corresponds to the planarization film according to the present disclosure. Further, in the embodiment described above, the lens material film 140 corresponds to the lens material film according to the present disclosure. Further, in the embodiment described above, the on-chip lenses ML correspond to the on-chip lenses according to the present disclosure. Further, in the embodiment described above, the antireflection film 150 corresponds to the antireflection film according to the present disclosure. Further, in the embodiment described above, the camera 40 corresponds to the electronic apparatus according to the present disclosure.

The present disclosure contains subject matter related to that disclosed in Japanese Priority Patent Application JP 2010-225090 filed in the Japan Patent Office on Oct. 4, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
 a pad electrode, a sidewall of the pad electrode extending from a first surface of the pad electrode to a second surface of the pad electrode;
 a carbon-based inorganic film between a passivation film and said pad electrode, said carbon-based inorganic film physically isolating said passivation film from said first surface of the pad electrode;
 a multilayer wiring layer between a semiconductor substrate and said pad electrode, a portion of the passivation film touching said sidewall of the pad electrode and a surface of the multilayer wiring layer.

2. The solid-state imaging device according to claim 1, wherein said surface of the multilayer wiring layer touches said second surface of the pad electrode.

3. The solid-state imaging device according to claim 2, wherein said portion of the passivation film extends from a surface of the carbon-based inorganic film to said surface of the multilayer wiring layer.

4. The solid-state imaging device according to claim 1, wherein said pad electrode is an electrically-conductive material.

5. The solid-state imaging device according to claim 1, wherein said carbon-based inorganic film is an inorganic material that contains carbon.

6. The solid-state imaging device according to claim 1, wherein said carbon-based inorganic film is a material from the group consisting of graphite, graphene, carbon nanotubes, diamond-like carbon, and amorphous carbon.

7. The solid-state imaging device according to claim 1, wherein said passivation film is an electrical insulator.

8. The solid-state imaging device according to claim 1, wherein said passivation film includes a silicon oxide.

9. The solid-state imaging device according to claim 1, wherein said passivation film includes a silicon nitride.

10. The solid-state imaging device according to claim 1, further comprising:
 an opening through said passivation film and said carbon-based inorganic film, an electrically-conductive member within said opening touching said first surface of the pad electrode.

11. The solid-state imaging device according to claim 10, wherein said opening terminates at said first surface of the pad electrode.

12. The solid-state imaging device according to claim 10, further comprising:
 a wire directly electrically connected to said electrically-conductive member.

13. The solid-state imaging device according to claim 1, further comprising:
 an on-chip lens between an antireflection film and a photodiode region of the semiconductor substrate, a refractive index of the antireflection film being lower than a refractive index of the on-chip lens.

14. The solid-state imaging device according to claim 13, wherein said on-chip lens is an organic material.

15. The solid-state imaging device according to claim 13, wherein said on-chip lens is a resin.

16. The solid-state imaging device according to claim 13, further comprising:
    a planarization film between said passivation film and said on-chip lens.

17. The solid-state imaging device according to claim 16, wherein said planarization film is an organic material.

18. The solid-state imaging device according to claim 16, wherein said planarization film is a resin.

19. The solid-state imaging device according to claim 16, further comprising:
    a color filter between said on-chip lens and said planarization film.

20. An electronic apparatus comprising:
    the solid-state imaging device according to claim 1;
    an optical system configured to direct incident light onto said solid-state imaging device;
    a signal processing circuit unit configured to convert a signal charge into digital information,
    wherein said solid-state imaging device is configured to convert said incident light into said signal charge.

* * * * *